(12) United States Patent
Panat et al.

(10) Patent No.: US 9,969,001 B2
(45) Date of Patent: May 15, 2018

(54) THREE-DIMENSIONAL PASSIVE COMPONENTS

(71) Applicant: Washington State University, Pullman, WA (US)

(72) Inventors: Rahul P. Panat, Pullman, WA (US); Deuk H. Heo, Pullman, WA (US)

(73) Assignee: Washington State University, Pullman, WA (US)

( * ) Notice: Subject to any disclaimer, the term of this patent is extended or adjusted under 35 U.S.C. 154(b) by 114 days.

(21) Appl. No.: 14/964,451

(22) Filed: Dec. 9, 2015

(65) Prior Publication Data

US 2016/0172099 A1 Jun. 16, 2016

Related U.S. Application Data

(60) Provisional application No. 62/090,319, filed on Dec. 10, 2014.

(51) Int. Cl.
*B22F 3/105* (2006.01)
*G06F 1/16* (2006.01)
(Continued)

(52) U.S. Cl.
CPC ............ *B22F 3/1055* (2013.01); *B22F 3/008* (2013.01); *G06F 1/163* (2013.01); *H01F 27/24* (2013.01); *H01F 27/2804* (2013.01); *H01F 41/0206* (2013.01); *H01F 41/046* (2013.01); *H01G 4/002* (2013.01); *H01G 4/1218* (2013.01); *H01P 11/001* (2013.01); *H05K 1/028* (2013.01); *H05K 1/0283* (2013.01); *H05K 1/0296* (2013.01); *H05K 1/0313* (2013.01);
(Continued)

(58) Field of Classification Search
CPC ...... H01L 23/5227; H01L 28/10; H01L 27/08; H01L 2924/3011
See application file for complete search history.

(56) References Cited

U.S. PATENT DOCUMENTS 5,703,740 A * 12/1997 Cohen .................. G11B 5/3113
360/123.15
2002/0017399 A1 2/2002 Chang et al.
(Continued)

OTHER PUBLICATIONS

PCT Search Report and Written Opinion dated Apr. 13, 2016 for PCT Application No. PCT/US15/64983, 11 pages.
(Continued)

*Primary Examiner* — Quoc Hoang
(74) *Attorney, Agent, or Firm* — Lee & Hayes, PLLC

(57) ABSTRACT

Three-dimensional inductors may comprise a passivation layer disposed on a substrate, a three-dimensional pillar comprising a ferromagnetic material disposed on the substrate or the passivation layer, and a conductive trace wound at least partially around the pillar. Three-dimensional capacitors may comprise a passivation layer disposed on a substrate, at least two support pillars comprising a polymeric material disposed on the passivation layer or the substrate, at least two electrodes disposed between the support pillars, a dielectric disposed between the electrodes, and a metal trace. Methods of manufacturing the three-dimensional passives, such as inductors and capacitors, may comprise direct writing the components and curing them for on-chip applications.

10 Claims, 15 Drawing Sheets

(51) Int. Cl.
*H01F 27/24* (2006.01)
*H01F 27/28* (2006.01)
*H01F 41/02* (2006.01)
*H01F 41/04* (2006.01)
*H01G 4/12* (2006.01)
*H01P 11/00* (2006.01)
*H05K 1/02* (2006.01)
*H05K 1/03* (2006.01)
*H05K 1/09* (2006.01)
*H05K 3/14* (2006.01)
*H05K 3/22* (2006.01)
*H05K 3/46* (2006.01)
*H01G 4/002* (2006.01)
*B22F 3/00* (2006.01)
*B33Y 10/00* (2015.01)
*B33Y 50/02* (2015.01)
*H05K 1/16* (2006.01)
*B33Y 80/00* (2015.01)
*B22F 1/00* (2006.01)

(52) U.S. Cl.
CPC ............. *H05K 1/0393* (2013.01); *H05K 1/09* (2013.01); *H05K 3/14* (2013.01); *H05K 3/22* (2013.01); *H05K 3/4644* (2013.01); *B22F 1/0018* (2013.01); *B22F 2003/1058* (2013.01); *B33Y 10/00* (2014.12); *B33Y 50/02* (2014.12); *B33Y 80/00* (2014.12); *C22C 2202/02* (2013.01); *H05K 1/165* (2013.01); *H05K 2201/0162* (2013.01)

(56) References Cited

U.S. PATENT DOCUMENTS

2008/0052904 A1   3/2008   Schneider
2010/0288543 A1   11/2010  Hung et al.
2011/0163414 A1   7/2011   Lin et al.
2014/0203443 A1   7/2014   Pagaila et al.

OTHER PUBLICATIONS

PCT Invitation to Pay Additional Fees dated Jan. 28, 2016 for PCT Application No. PCT/USI5/64983, 2 pages.

* cited by examiner

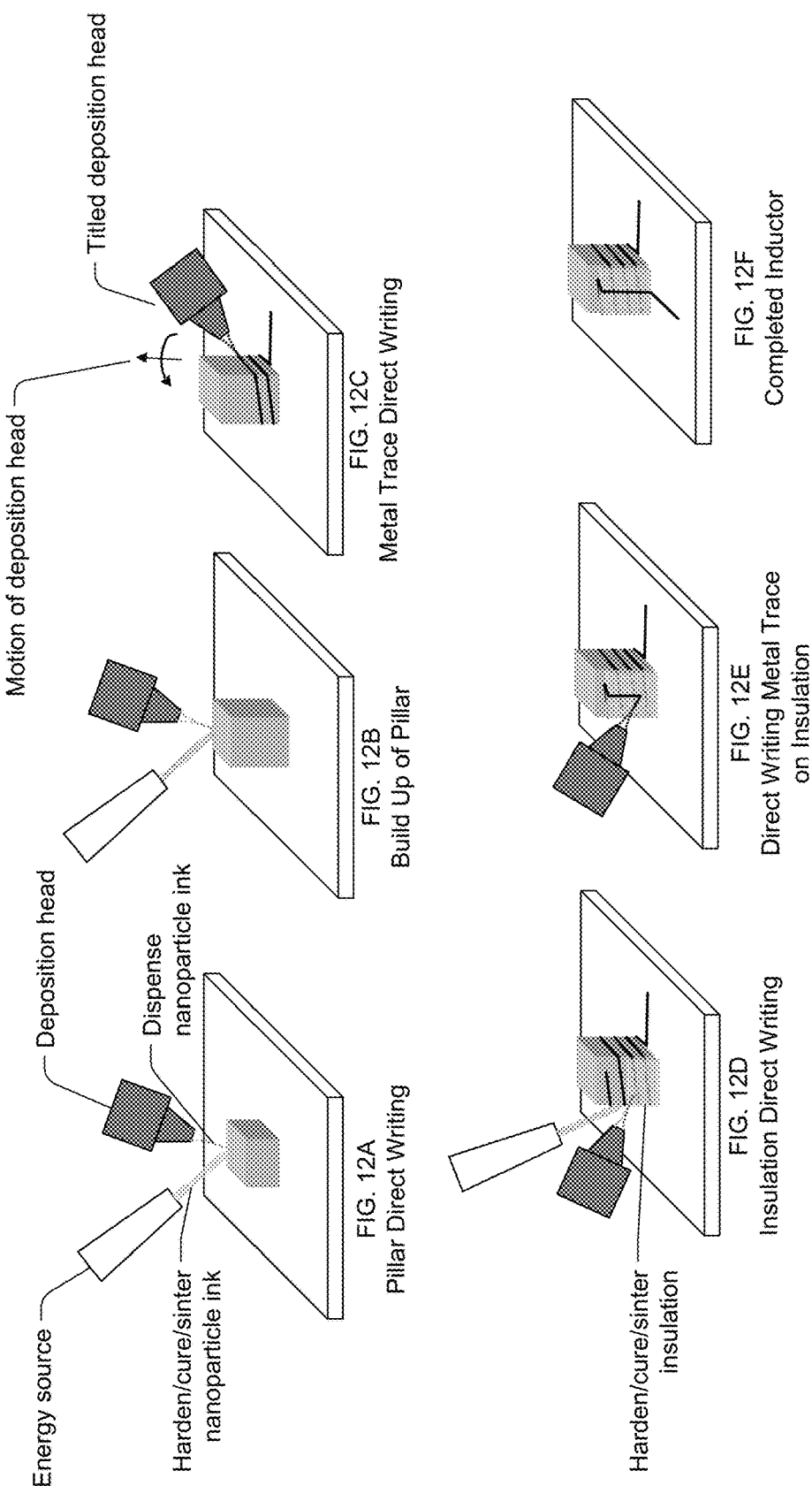

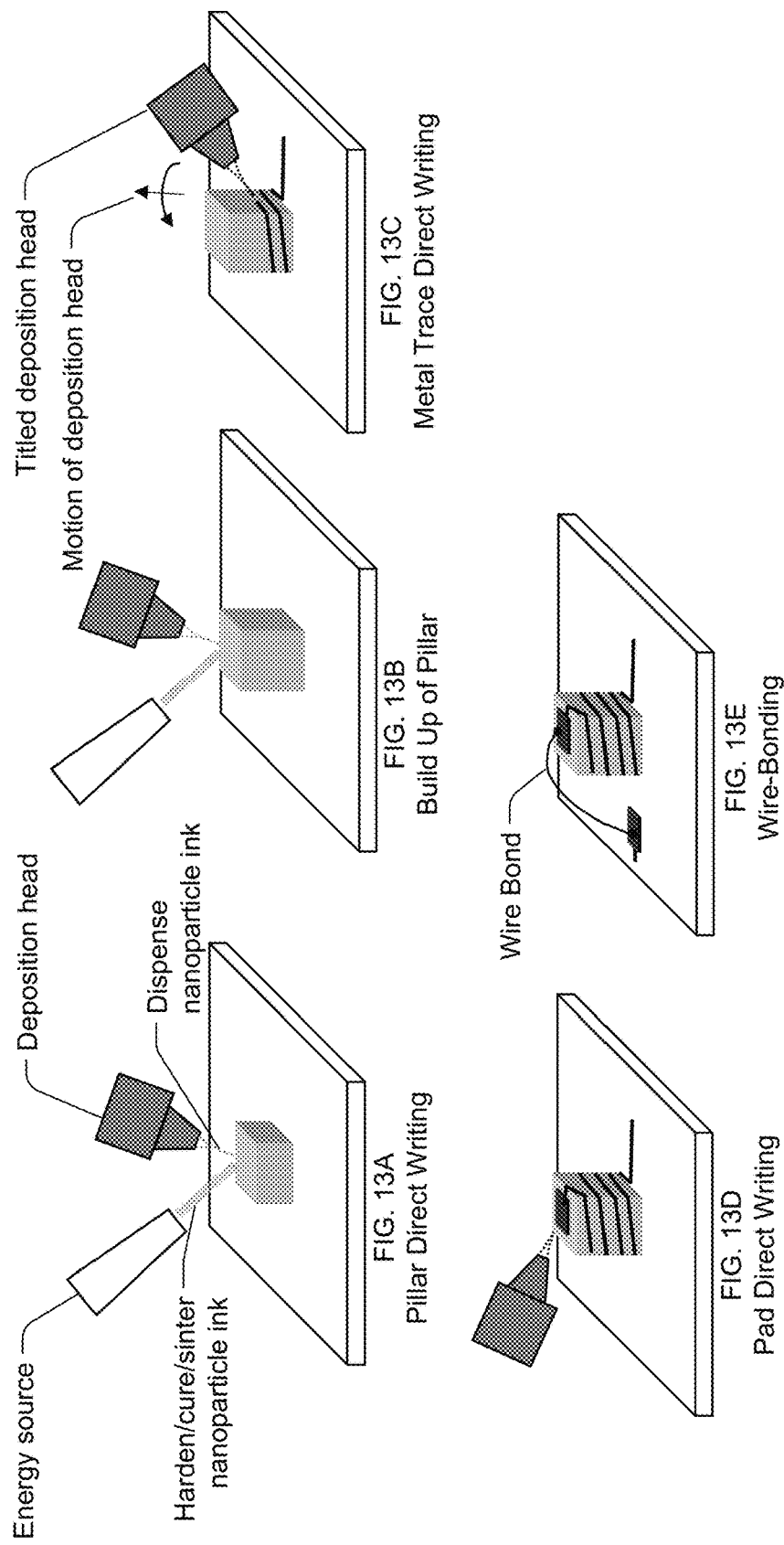

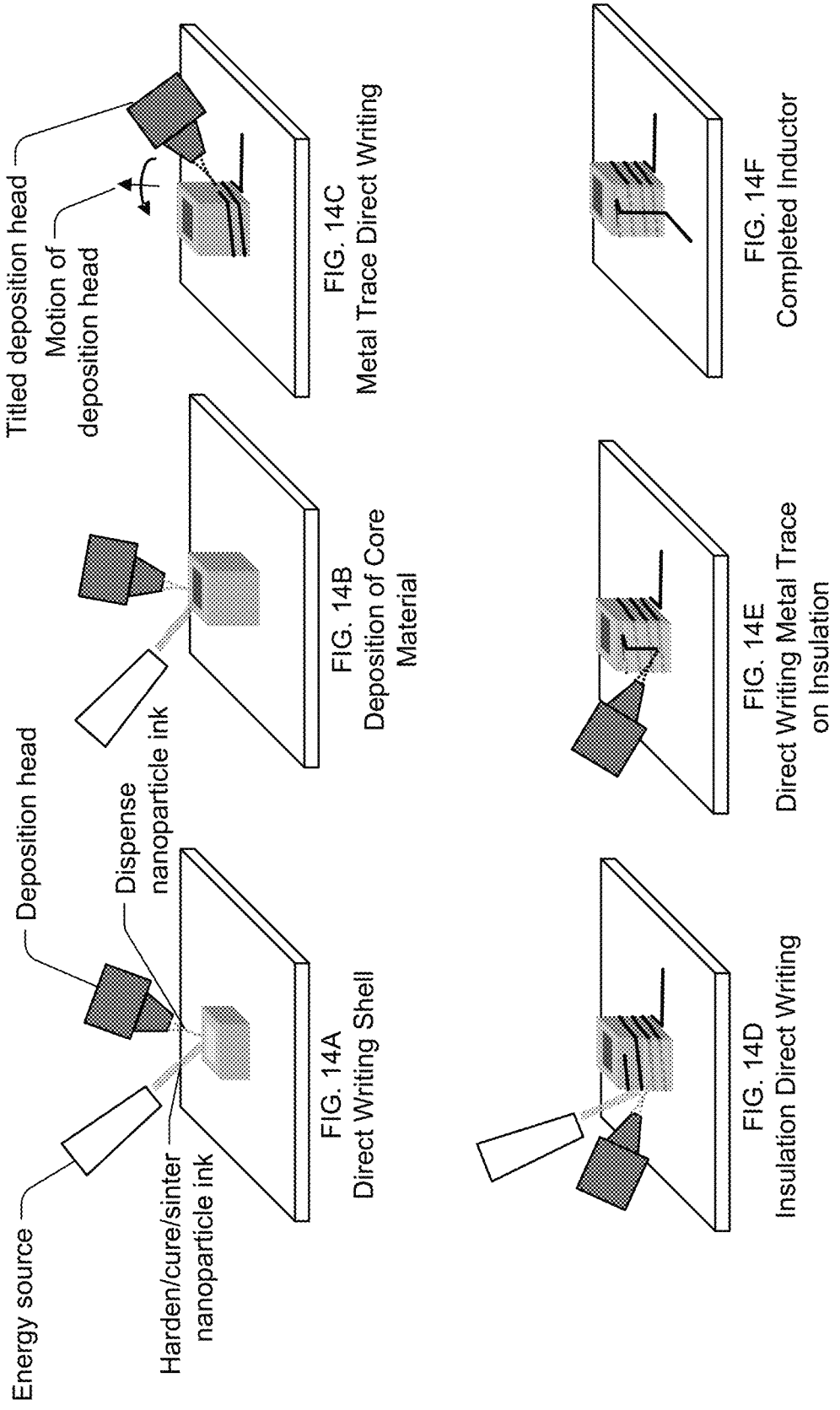

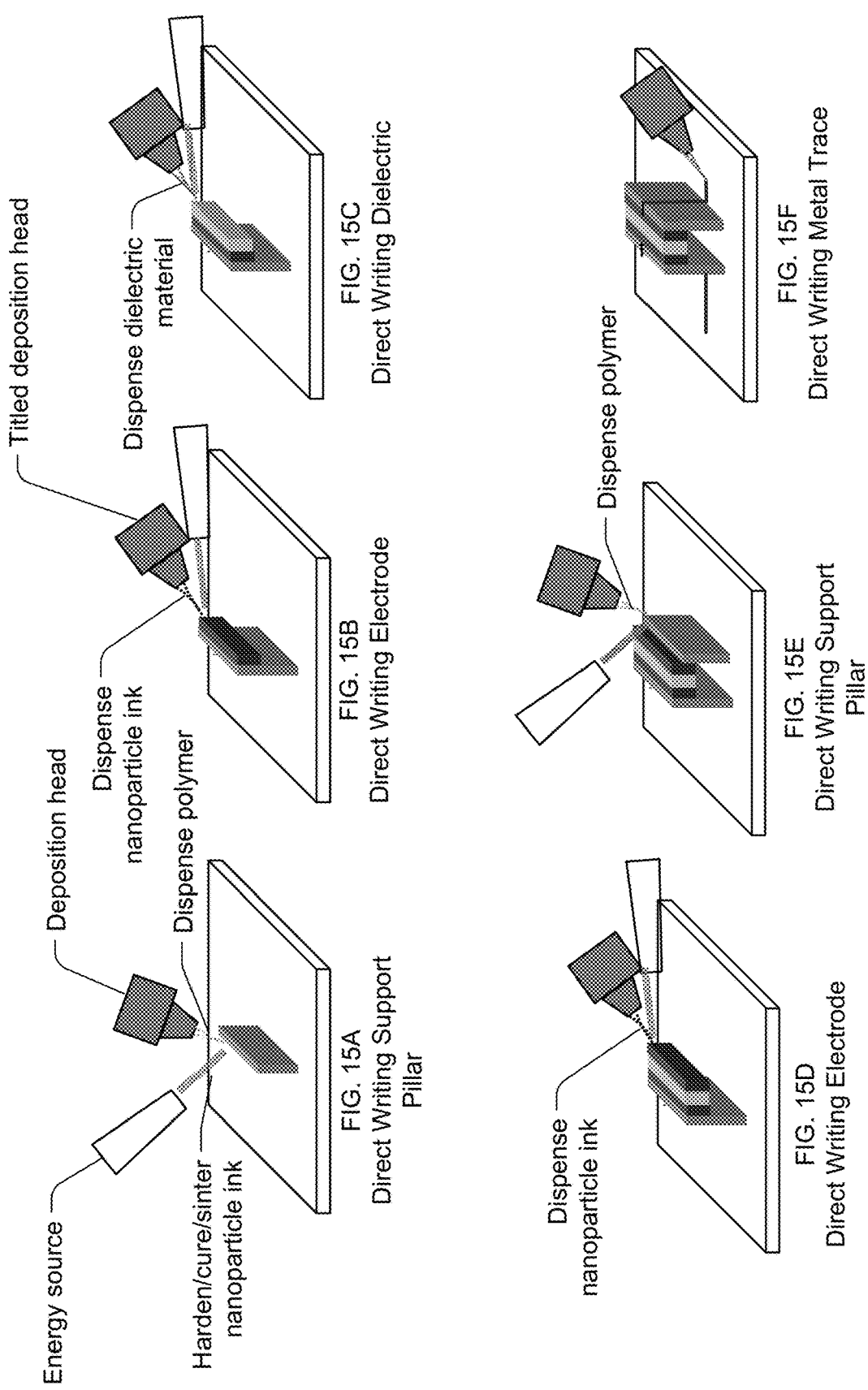

THREE-DIMENSIONAL PASSIVE COMPONENTS

CROSS REFERENCE TO RELATED APPLICATION

This application claims priority to U.S. Provisional Patent Appln. No. 62/090,319 filed Dec. 10, 2014, entitled "Manufacturing Methods and Connections for Chips," which is incorporated by reference in its entirety.

BACKGROUND

A number of passive components or "passives" are typically found in electronic hardware systems. Passive components typically include inductors, capacitors, and fuses that are manufactured by evaporation, tape casting, and/or screen printing. Passives can also be manufactured using direct-write printing methods such as aerosol jet or passive inkjet or screen printing in a substrate plane or layer. These manufacturing approaches result in two-dimensional geometries wherein the passive component is manufactured into the build-up layers of an integrated circuit chip. Such two dimensional geometries hinder system level compaction and result in high parasitic energy loss. Additionally, in dynamic voltage frequency scaling (DVFS), voltage regulators are used to scale output voltages in an attempt to save power in a system. Conventional two-dimensional off-chip voltage regulators cannot provide the high speed responses needed for DVFS and can consume significant operating area. Moreover, long interconnects between off-chip voltage regulators and on-chip loads introduce large parasitic impedance, which can hinder the ability to provide clean and stable supply voltages.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIGS. 12A-12F illustrate an example manufacturing method for a three-dimensional inductor.

FIGS. 13A-13E illustrate another example manufacturing method for a three-dimensional inductor.

FIGS. 14A-14F illustrate a further example manufacturing method for a three-dimensional inductor.

FIGS. 15A-15F illustrate an example manufacturing method for a three-dimensional capacitor.

DETAILED DESCRIPTION

Overview

Figure 1:
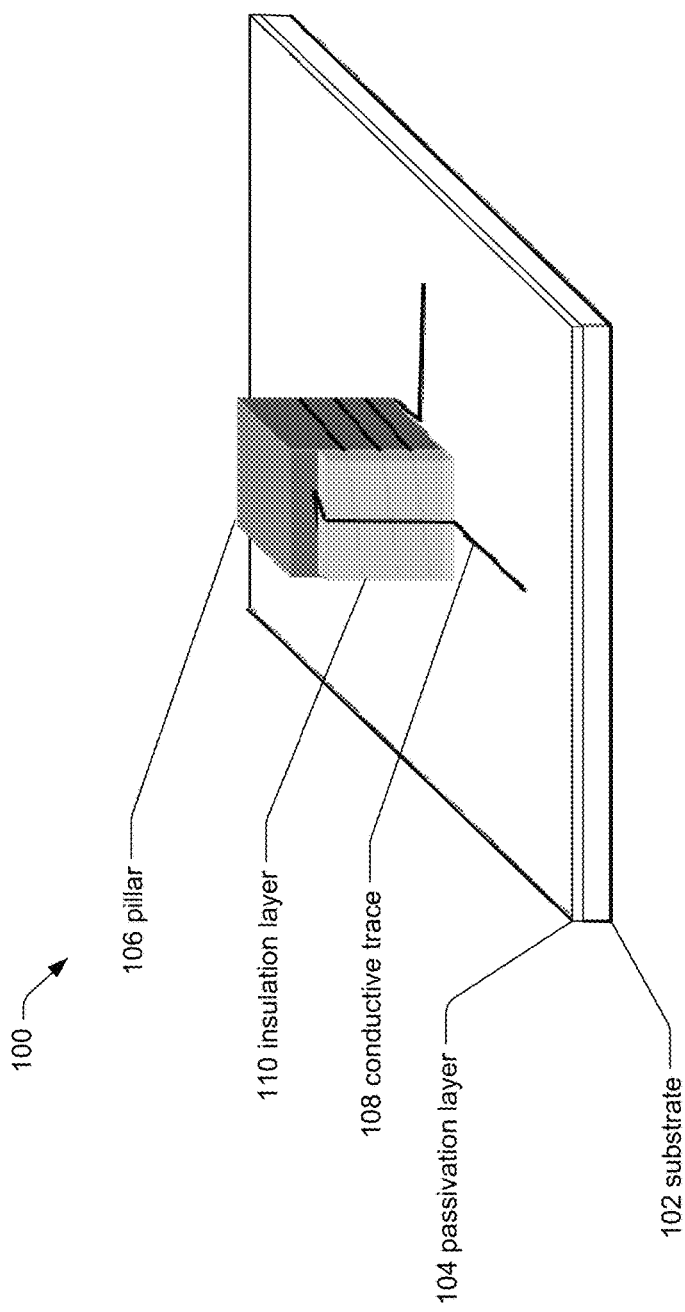
FIG. 1 illustrates a perspective view of an example three-dimensional inductor.

This overview, including section titles, is provided to introduce a selection of concepts in a simplified form that are further described below. The overview is provided for the reader's convenience and is not intended to limit the scope of the implementations or claims, nor the proceeding sections.

This disclosure describes three-dimensional passive component architectures and methods of manufacturing the same.

As discussed above, two-dimensional passive geometries hinder system level compaction and result in high parasitic energy loss. These hindrances have led to off-chip voltage regulator designs that have significant drawbacks in dynamic voltage frequency scaling, as well as impedance issues on on-chip designs. Example three-dimensional passive component architectures and methods of manufacturing the same as described herein allow for passive components to be disposed outside of a chip substrate such that the passive components are not hindered or otherwise influenced by the substrate material. These passive components alleviate the shortcomings of current two-dimensional architectures by allowing for on-chip voltage regulation, on-chip chip-to-chip communication, compaction, and decreased parasitic loss. The devices described herein comprise three-dimensional passive components, such as inductors and capacitors, manufactured via direct-write methodologies to assist in on-chip power regulation and supply, for example.

In some examples, a three-dimensional inductor architecture may comprise a substrate with a passivation layer disposed on a surface of the silicon chip. A pillar may also be disposed on at least a portion of the passivation layer. In some examples, the substrate may also be made of any other solid material such as glass. In some examples, the pillar may comprise a ferromagnetic material and may have a three-dimensional structure projecting out from the substrate. In other examples, the core may comprise an electrically insulating material such as polymer and may have a three-dimensional structure projecting out from the substrate. An electrically conductive (hereafter referred to as "conductive") trace may be wound at least partially around the pillar to create an inductor. In some examples, the conductive trace may comprise sintered metal nanoparticles or a conductive polymer. An insulation layer may be disposed proximate to the pillar, and the conductive trace may be at least partially written on the insulation layer as the conductive trace continues away from the pillar. The insulation layer may be composed of an insulating material such as a polymeric material. In examples, the conductive trace may terminate at a pad disposed at or near the top of the pillar. The pad may be constructed of a conductive material such as sintered metal nanoparticles or a conductive polymer. A conducting wire may be disposed between the pad and the substrate to allow for an outgoing signal from the pillar. The inductor may be disposed on the passivation layer by direct writing techniques as described herein to be used with switching regulators, for example, in an on-chip design.

In some examples, a three-dimensional capacitor architecture may comprise a substrate with a passivation layer disposed on a surface of the silicon chip. In some examples, the substrate may also be made of any other solid material such as glass. The capacitor may comprise at least two support pillars disposed on at least a portion of the passivation layer. The at least two support pillars may be constructed from a polymeric material. At least two electrodes may be disposed between the support pillars. A dielectric may be disposed at least partially between the two electrodes and may be in contact with the electrodes. In some examples, the support pillars may be constructed from a conducting material such as sintered metal nanoparticles or a cured conducting polymer and may act as the electrodes, or a portion of the electrodes. In such examples, a dielectric may be disposed at least partially between the two pillars (i.e., electrodes). As used herein, the dielectric may be considered an electrical insulator that can be polarized by an applied electric field. In some examples, the dielectric may be air, and may define a gap between the electrodes. The capacitor may also comprise a conductive trace that may be in contact with the support pillars and the electrodes. In some examples, the conductive trace may comprise sintered metal nanoparticles or a conductive polymer. The capacitor may be disposed on the passivation layer by direct writing techniques as described herein.

In further examples, a method of manufacturing three-dimensional inductors may comprise direct writing a three-dimensional pillar, comprising a nanoparticle ink or a polymer with or without embedded nanoparticles, onto a surface of a substrate. The pillar can have a number of geometries, cross-section of which may be, for example, rectangular, circular, truncated conical, or other shapes. The pillar may also have a height of less than or greater than 1 mm. The method may also comprise hardening, curing, or sintering of the nanoparticle ink or polymer, which may occur instantaneously with deposition of the nanoparticle ink or polymer, using ultraviolet light or other suitable techniques, including but not limited to, heating, oxidizing, laser, photonic flash, and chemical reaction. A trace comprised of metal nanoparticles or other conducting materials may be direct written around at least a portion of the three-dimensional pillar and may be cured or sintered, in some examples instantaneously with deposition of the material, using a source of energy such as ultraviolet light or heat. In some examples, the nanoparticle ink can be first hardened upon deposition on the three-dimensional pillar followed by sintering to create the three-dimensional inductor. An insulation layer may be direct written proximate to the pillar such that a portion of the conductive trace may be kept out of contact with the portion of the conductive trace that is wound around the pillar. In some examples, the conductive trace may terminate at a pad that is direct written at or near the top of the pillar. A conductive wire may be disposed between the pad and the substrate by, for example, wire bonding to allow for an outgoing signal. This process, or particular operations thereof, may be repeated to create multiple inductors on a substrate.

In still further examples, a method of manufacturing three-dimensional capacitors may comprise directly writing a first three-dimensional support pillar, comprising a polymer, onto a surface of a substrate. The method may also comprise hardening or curing the polymer of the first three-dimensional pillar, in some cases instantaneously upon deposition, using ultraviolet light or other techniques, including but not limited to, heating, oxidizing, laser, photonic flash, and chemical reaction. A first electrode comprising a conductive nanoparticle ink or a conductive polymer may be directly written onto a surface of the first three-dimensional pillar and may be hardened and/or cured upon reaching the pillar. A dielectric comprising a non-conducting polymer or a nanoparticle ink or a polymer with embedded nanoparticles may be directly written onto a surface of the first electrode and may be hardened and/or cured upon reaching the electrode using an energy source. A second electrode comprising a conductive nanoparticle ink or a conductive polymer may be directly written onto a surface of the dielectric and may be hardened upon reaching the dielectric. A second three-dimensional pillar may be directly written on the surface of the substrate such that the second three-dimensional pillar is in contact with the second electrode. The second pillar may be cured. In some examples, the dielectric may be positioned such that it is in contact with both electrodes but is held away from the passivation layer of the substrate. The method may also comprise directly writing a trace of metal nanoparticle ink or a conductive polymer onto the two support pillars and the electrodes, and curing and/or sintering the trace to create the three-dimensional capacitor. In some examples, the process of directly writing and sintering and/or curing electrodes and dielectrics may be repeated such that the capacitor comprises multiple electrodes on either side of the capacitor structure. The above processes, or particular operations thereof, may be repeated to create multiple capacitors on a substrate.

Three-dimensional passive component architectures according to this disclosure may be designed for a variety of applications, such as, for example, on-chip voltage regulation, on-chip chip-to-chip communication, high performance electronic circuits for defense applications, compactions for flexible electronics, millimeter wave antennas, and aircraft communication hardware.

One or more examples of the present disclosure are illustrated in the accompanying drawings. Those of ordinary skill in the art will understand that the devices and methods specifically described herein and illustrated in the accompanying drawings are non-limiting examples and that the scope of these examples is defined solely by the claims. The features illustrated or described in connection with one example may be combined with the features of other examples. For example, the conductive trace described in an example inductor may be included in a device comprising a capacitor, and vice versa. Such modifications and variations are intended to be included within the scope of the appended claims.

Additional details are described below with reference to several examples.

Example Devices

FIGS. 1-9 illustrate various examples of three-dimensional passive component architectures. The sizes, shapes, and symbols used to describe the various components of the devices are used for illustration only and should not be used as limitations of the devices as described herein.

FIG. 1 is a perspective view of an example of a three-dimensional inductor device 100. Device 100 may comprise a substrate 102. The substrate 102 may be any substrate used in microelectronics, but in some examples, the substrate 102 may be silicon based. The substrate 102 may also comprise a variety of geometries and have a planar or non-planar surface, but in the example of FIG. 1, the substrate 102 is shown as having a rectangular geometry and a planar surface. Device 100 may also comprise a passivation layer 104 disposed on a surface of the substrate 102. The passivation layer 104 may also be disposed on more than one surface of the substrate 102, but in FIG. 1, the passivation layer 104 is shown as covering the upper surface of the substrate 102. The passivation layer 104 may cover all or only a portion of the substrate 102. The passivation layer 104 may comprise any material that enhances the effectiveness of the substrate 102. In some examples, the passivation layer 104 may be constructed of an oxide, such as, for example, silicon dioxide or titanium dioxide. In other examples, the passivation layer 104 may be constructed of silicon nitride. The passivation layer 104 may have a variety of thicknesses and densities depending on the properties of the substrate 102, for example, the passivation layer 104 may have a thickness of approximately 1-2 µm when the substrate 102 has a thickness of approximately 600 µm.

Device 100 may also comprise a pillar 106 disposed on at least a portion of the passivation layer 104 or the substrate 102. The pillar 106 may comprise a ferromagnetic material, such as, for example, sintered or non-sintered nanoparticles of iron, barium titanate, germanium telluride, polyvinylidene fluoride, or a combination thereof. Additionally, the pillar 106 may be constructed of a polymer or of a composite consisting of ferromagnetic nanoparticles mixed with a polymer that can be cured substantially instantaneously upon deposition by, for example, ultraviolet light. Other sintering or curing techniques, including but not limited to, heating, oxidizing, laser, photonic flash, and chemical reaction may be used. The pillar 106 may also define a number of geometries, such as, for example, a rectangular cuboid, a cube, a cylinder, or some other shape that may roughly resemble a rectangular cuboid, cube, or cylinder with slight variances in shape. The pillar 106 may also have gradually changing cross-sections with respect to height as in a truncated cone. In some examples, the pillar 106 may comprise a three-dimensional structure that may project out from the substrate 102. More specifically, unlike conventional passive structures that are planar and embedded in one or more layers of the substrate 102, the pillar 106 may project from the substrate 102, such as, for example, from the top layer of the substrate 102. The pillar 106 may not extend into the substrate 102. In some examples, the pillar 106 may project from the substrate 102 less than 1 mm, while in other examples, the pillar 106 may project from the substrate 102 more than 1 mm. By way of further example, the pillar 106 may project from the substrate 102 between approximately 200 µm and approximately 1 mm, which may result in less parasitic loss within the system due to the pillar 106 not being embedded in the substrate 102. The pillar 106 may also project from the substrate 102 between 1 mm and 3 mm, which may provide greater inductance due to the increased mass of the pillar 106. The pillar 106 may be solid (otherwise known as filled) or may comprise a partially hollow interior. In some examples, the pillar 106 may project transversely from the substrate 102, such as, for example, at approximately a 90° angle. In other examples, the pillar 106 may project from the substrate 102 at an angle between 0° and 90° from the plane of the substrate 102.

Device 100 may also comprise a conductive trace 108 that may be wound at least partially around the pillar 106. The conductive trace 108 may be bonded to the pillar 106 or may be a separate component from the pillar 106. The conductive trace 108 may comprise a conductive material, such as, for example, a sintered nanoparticle ink of silver, cupric oxide, copper, platinum, gold, aluminum, or a combination thereof. In some examples, the conductive trace 108 can be made up of other suitable materials such as a conductive polymer. In some examples, the conductive trace 108 may define a coil that may be wound at least partially around the pillar 106. For example, as shown in FIG. 1, a portion of the conductive trace 108 may be disposed on the passivation layer 104 and/or may be embedded partially or wholly in the passivation layer 104 or the substrate 102. This portion of the conductive trace 108 may define an input to receive an incoming signal. The conductive trace 108 may be wound around the pillar 106 once or multiple times. For example, FIG. 1 shows the conductive trace 108 wound around the pillar 106 three times. The number of times that the conductive trace 108 is wound around the pillar 106 is not limiting, and may be as little as less than 1 complete revolution or as many times as possible such that the exterior sides of the pillar 106 are completely or substantially completely surrounded by the conductive trace 108 without the coils of the conductive trace 108 touching each other. The spacing of the coils may also vary. The conductive trace 108 may also have a variety of thicknesses. For example, the conductive trace 108 may have a thickness in the nanometer range, in the micrometer range, or, in some examples where the pillar 106 projects out from the substrate 102 more than 1 mm, the conductive trace 108 may have a thickness in the millimeter range. The conductive trace 108 may be an approximately rectangular, circular, or square cross-section with a width in the micrometer range, such as, for example, approximately 10 µm. A portion of the conductive trace 108, once wound around the pillar 106, may continue onto an insulation layer 110. The insulation layer 110 may allow a portion of the conductive trace 108 to extend away from the coils wound around the pillar and back toward the passivation layer 104 or the substrate 102. The conductive trace 108 may be coupled or otherwise in electronic communication with other components disposed within the substrate 102 or other components coupled to the substrate 102. This portion of the conductive trace 108 may define an output to transmit an outgoing signal. In some examples, the signal may travel in a reverse direction depending upon the requirements of the connected electrical circuit.

Figure 2:
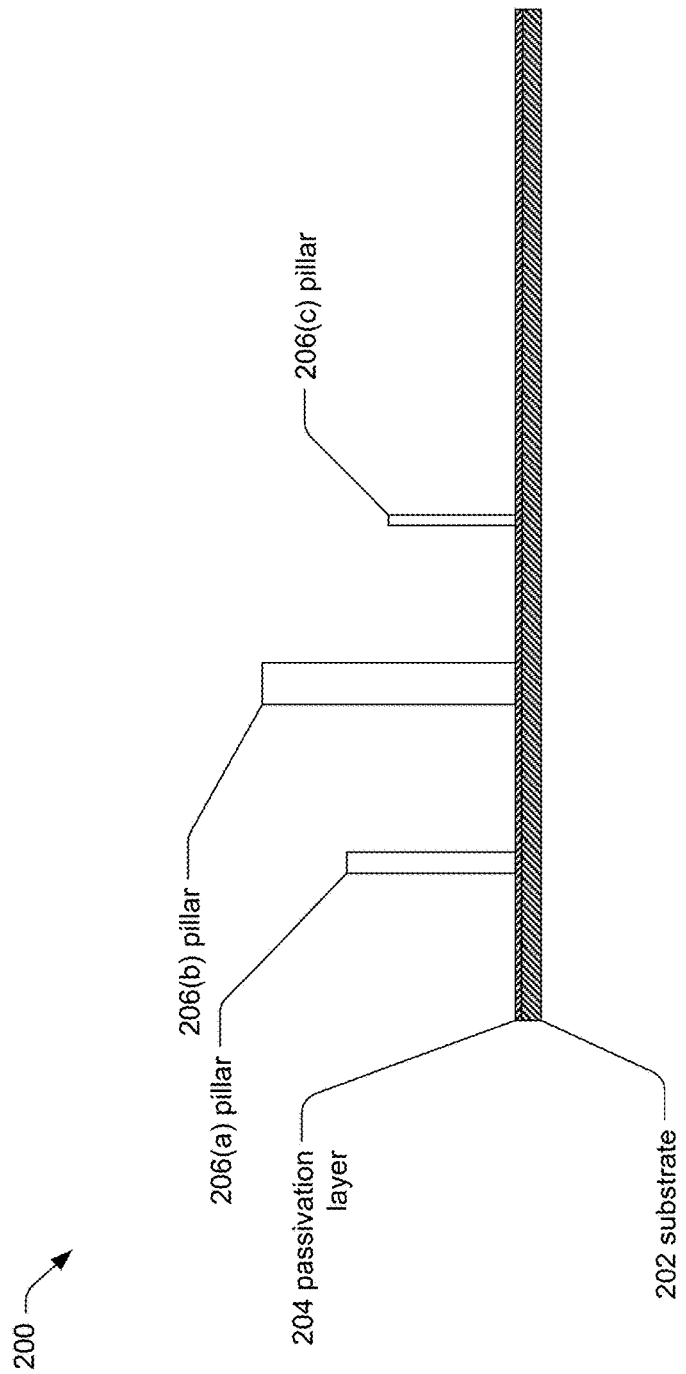
FIG. 2 illustrates a cross-sectional side view of example three-dimensional inductors.

FIG. 2 is a cross-sectional side view of multiple inductors in device 200, which may be similar to device 100 illustrated in FIG. 1. Device 200 may have the same or similar components as those shown in FIG. 1. For example, device 200 may comprise a substrate 202, a passivation layer 204, and pillars 206(a)-(c). FIG. 2 further illustrates that multiple pillars 206(a)-(c) may be disposed on the passivation layer 204 and/or the substrate 202. In some examples, the number of pillars may be as few as 1, such as shown in device 100. In other examples, the number of pillars may be from 1 to n pillars, where n represents as many pillars as will fit on the passivation layer 204 or the substrate 202 without the pillars touching. The number of pillars may vary in different applications, particularly given the varying geometric configurations of the pillars and the different sizes of pillars. As shown in FIG. 2, the three pillars 206(a)-(c) may have varying dimensions. For example, pillar 206(a) may project from the substrate 202 less than pillar 206(b) but more than pillar 206(c). Pillar 206(a) may also be thinner or otherwise take up less space on the passivation layer 204 than pillar 206(b) but more than pillar 206(c). In some examples, the multiple pillars 206(a)-(c) may be of uniform height and thickness, while in other examples, the multiple pillars 206(a)-(c) may be of varying heights and thicknesses.

Figure 3:
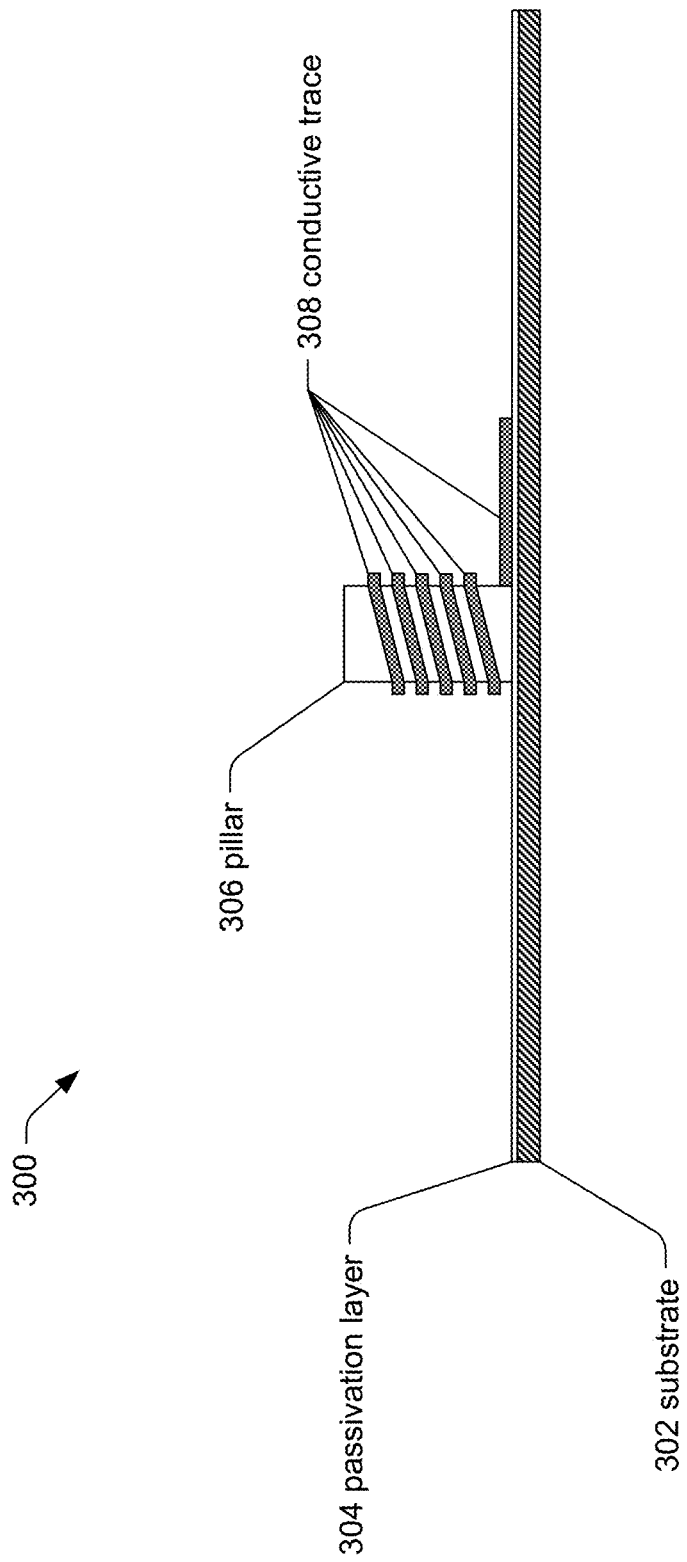
FIG. 3 illustrates a side view of another example three-dimensional inductor.

FIG. 3 is a cross-sectional side view of an inductor device 300, which may be similar to device 100 illustrated in FIG. 1. Device 300 may have the same or similar components as those shown in FIG. 1. For example, device 300 may comprise a substrate 302, a passivation layer 304, a pillar 306, and a metal trace 308. FIG. 3 illustrates an example of how the metal trace 308 may be wound at least partially around the pillar 306. For example, a portion of the metal trace 308 may be disposed on a surface of the passivation layer 304. This portion of the metal trace 308 may define an input to receive an incoming signal. The metal trace 308 may then wind up and around the pillar 306 one or more times. In the example shown in FIG. 3, the metal trace 308 is wound around the pillar 306 5 times. In some examples, each coil of the metal trace 308 may be in contact with the other coils of the metal trace 308 that are wound around the pillar 306. In other examples, a gap or separation between each coil of the metal trace 308 may be present.

Figure 4:
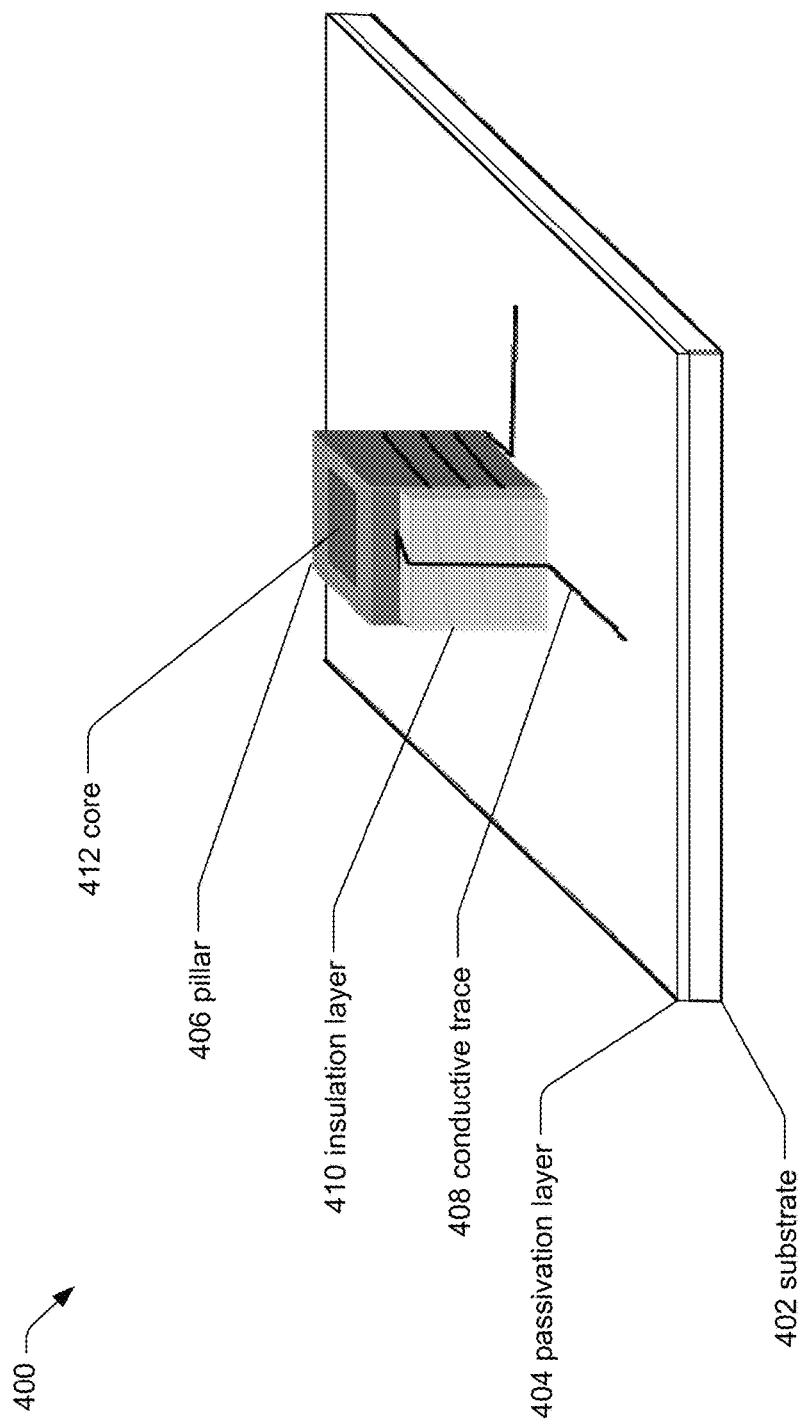
FIG. 4 illustrates a perspective view of a further example three-dimensional inductor.

FIG. 4 is a perspective view of an example three-dimensional inductor device 400. Device 400 may have the same or similar components as those shown in FIG. 1. For example, device 400 may comprise a substrate 402, a passivation layer 404, a pillar 406, a conductive trace 408, and an insulation layer 410. Device 400 shows a variation of the pillar 406. The pillar 406 may have a shell or exterior portion that may be constructed of a polymeric material or a polymeric material with embedded ferromagnetic nanoparticles. The pillar 406 may also have a core 412 that may be constructed of a ferromagnetic nanoparticle ink. The core 412 may be in a liquid state, or the core 412 may be cured or otherwise hardened into a substantially solid state. The core 412 may be covered in some examples with polymeric material, thereby encapsulating the core 412 in the shell.

Figure 5:
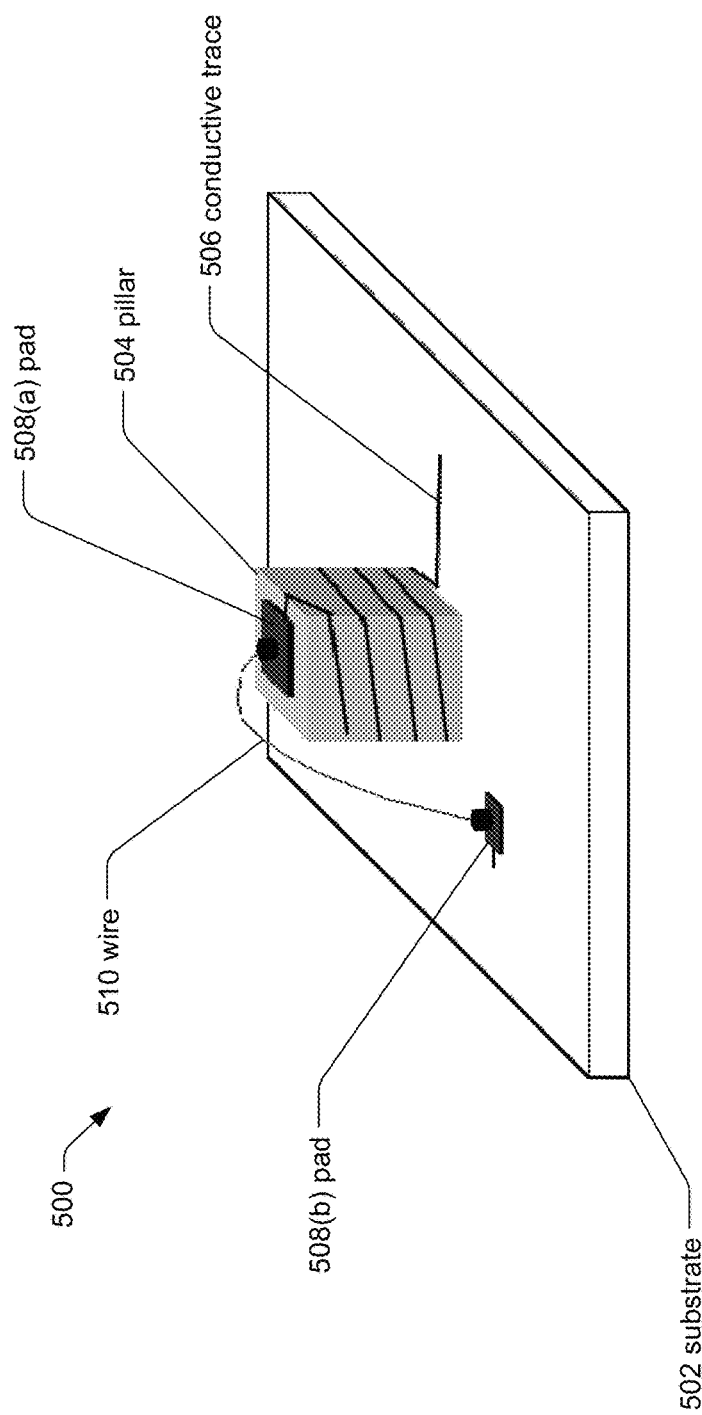
FIG. 5 illustrates a perspective view of yet another example three-dimensional inductor.

FIG. 5 is a perspective view of an example three-dimensional inductor device 500. Device 500 may have the same or similar components as those shown in FIG. 1. For example, device 500 may comprise a substrate 502, a pillar 504, and a conductive trace 506. Device 500 may also include pads 508(a) and 508(b). The pad 508(a) may be disposed at or near the top (surface opposite where the pillar 504 abuts the substrate 502) of the pillar 504. A conductive wire 510 may extend from the pad 508(a) to another pad 508(b) disposed on the substrate 502. In this example, electric current from the metal trace 506 may transfer to the pad 508(a), through the conductive wire 510, and to the other pad 508(b). The conductive wire 510 may be disposed such that it does not contact the coils of the conductive trace 506 that are wound around the pillar 504.

Figure 6:
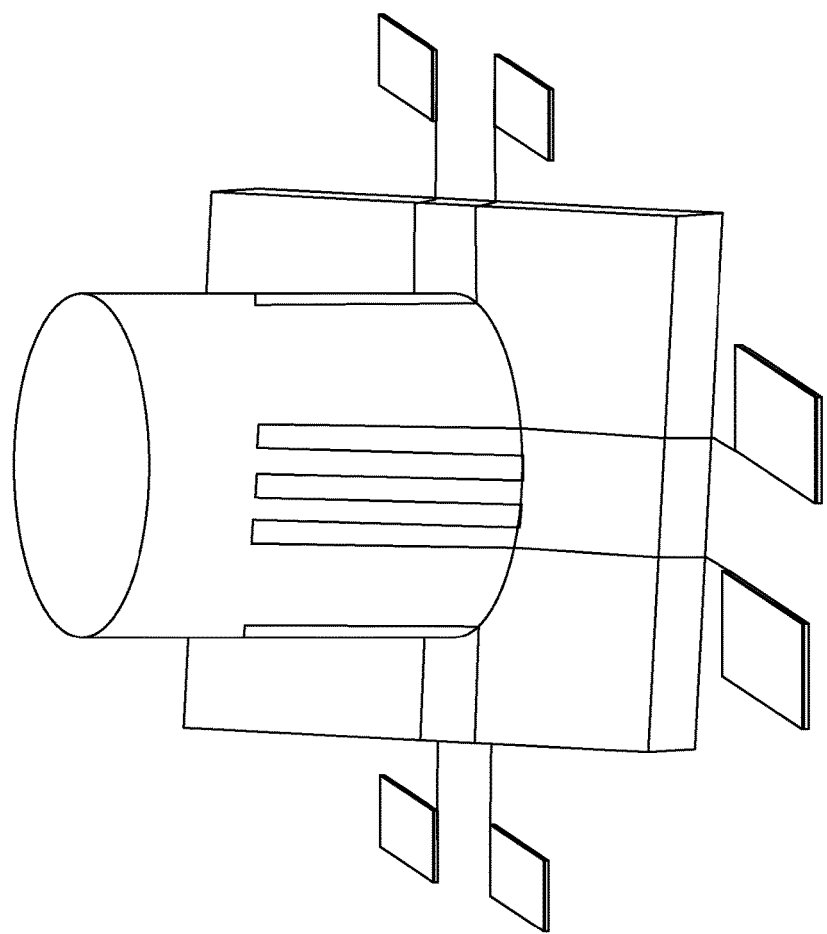
FIG. 6 is a photograph of an example three-dimensional inductor.

FIG. 6 is a photograph of an example three-dimensional inductor as described herein. In this example, the pillar includes a shell of polymeric material in a cylindrical configuration. A ferromagnetic core is disposed on the interior of the cylindrical configuration. The metal trace is disposed on the shell of the pillar and is disposed in a vertical configuration, as opposed to being wound around the pillar. In this example, multiple metal traces are disposed on the shell of the pillar. The polymeric shell shown in FIG. 6 was constructed of a curable polymeric material and cured instantaneously by ultraviolet energy to create the three-dimensional cylindrical configuration. In this example, the thickness of the polymeric shell is approximately 70 μm.

Figure 7:
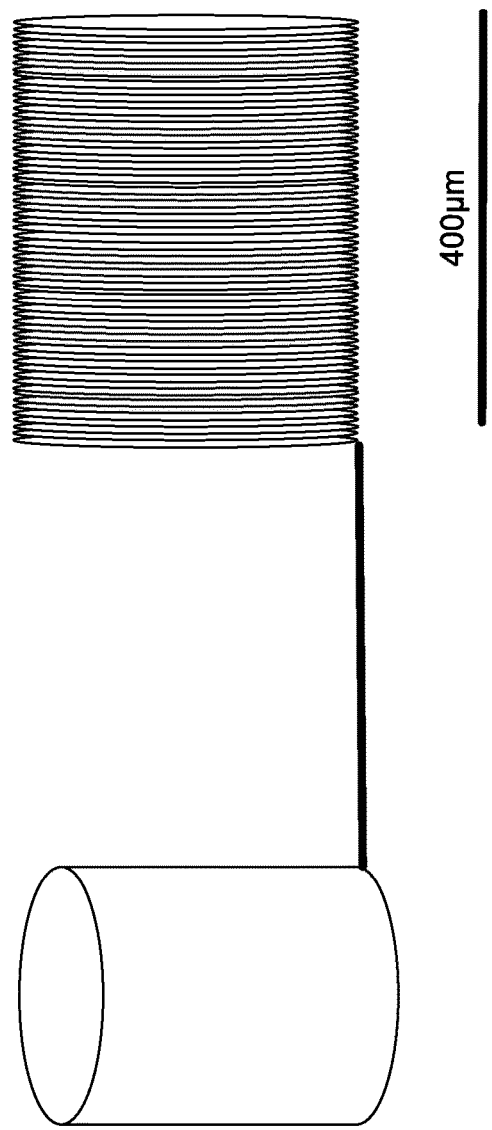
FIG. 7 is photograph of another example three-dimensional inductor.

FIG. 7 is another photograph of an example three-dimensional inductor as described herein. In this example, the pillar is constructed of a polymeric core. The conductive trace, in this example, travels from the pad on a substrate (object shown on the right-hand side) to the pillar (object shown on the left-hand side). The conductive trace, made of sintered metal nanoparticles, is also disposed on the exterior surface of the polymeric pillar and travels vertically up the pillar, as opposed to being wound around the pillar.

Figure 8:
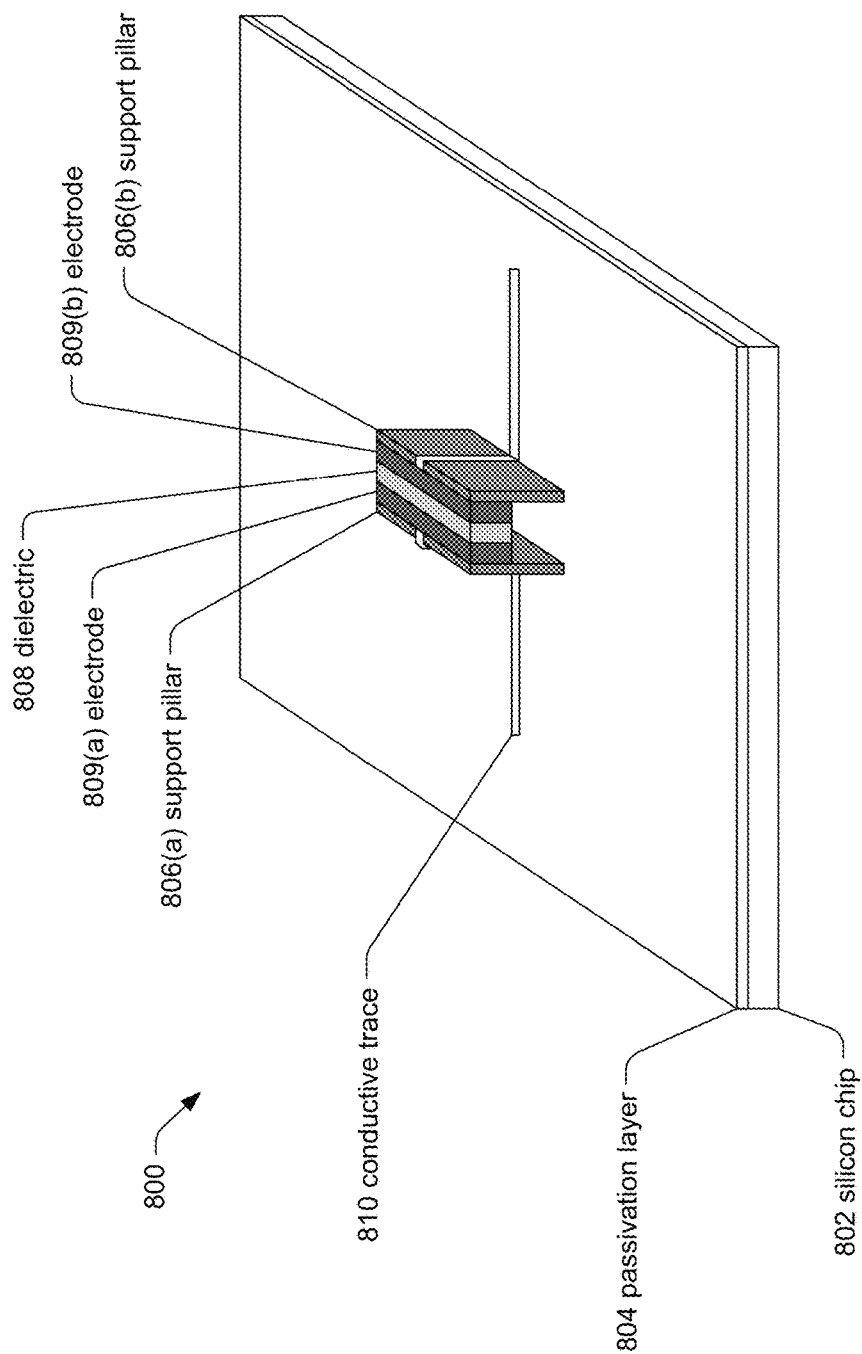
FIG. 8 illustrates a perspective view of an example three-dimensional capacitor.

FIG. 8 is a perspective view of an example three-dimensional capacitor device 800. Device 800 may comprise a substrate shown as a rectangular silicon chip 802 having a planar surface. The silicon chip 802 may be a substrate, such as substrate 102 from FIG. 1. The silicon chip 802 may comprise a plurality of layers, with some or all of the layers holding one or more components found in an integrated circuit. The silicon chip 802 may be any substrate used in microelectronics and may contain materials or chemical compositions other than silicon. The silicon chip 802 may also comprise a variety of geometries and have a planar or non-planar surface, but in the example of FIG. 8, the silicon chip 802 is shown as having a rectangular geometry and a planar surface. Device 800 may also comprise a passivation layer 804 disposed on a surface of the silicon chip 802. The passivation layer 804 may also be disposed on more than one surface of the silicon chip 802, but in FIG. 8, the passivation layer 804 is shown as covering the upper surface of the silicon chip 802. The passivation layer 804 may cover all or only a portion of the silicon chip 802. The passivation layer 804 may comprise any material that enhances the effectiveness of the silicon chip 802, such as, for example, by insulating and protecting the electronic circuitry of the silicon chip 802. In some examples, the passivation layer 804 may be constructed of an oxide, such as, for example, silicon dioxide or titanium dioxide. In other examples, the passivation layer 804 may additionally or alternatively be constructed of silicon nitride. The passivation layer 804 may have a variety of thicknesses and densities depending on the properties of the silicon chip 802.

Device 800 may also comprise at least two support pillars 806(a) and 806(b) that may be disposed on at least a portion of the passivation layer 804 or the silicon chip 802. In some examples, the two support pillars 806(a)-(b) may comprise a polymeric material, such as, for example, acrylate urethane. The two support pillars 806(a)-(b) may define a number of geometries, such as, for example, a rectangular cuboid, a cube, a cylinder, or some other shape that may roughly resemble a rectangular cuboid, a cube, or a cylinder with slight variances in shape. Additionally, support pillar 806(a) may have the same or a different geometry from pillar 806(b). In some examples, the support pillars 806(a)-(b) may comprise three-dimensional structures that may project out from the silicon chip 802. More specifically, unlike conventional passive structures that are in-plane and embedded in one or more layers of the silicon chip 802, the support pillars 806(a)-(b) may project from the silicon chip 802, such as, for example, from the top layer of the silicon chip 802. In some examples, the support pillars 806(a)-(b) may project from the silicon chip 802 less than 1 mm, while in other examples, the support pillars 806(a)-(b) may project from the silicon chip 802 more than 1 mm. By way of further example, the support pillars 806(a)-(b) may project from the silicon chip 802 between approximately 400 μm and approximately 1 mm, which may provide less parasitic loss within the system. The support pillars 806(a)-(b) may also project from the silicon chip 802 between approximately 1 mm and approximately 3 mm, which may provide greater capacitance. The support pillars 806(a)-(b) may be solid (otherwise known as filled) or may comprise partially hollow interiors. In some examples, the support pillars 806(a)-(b) may project transversely from the silicon chip 802, such as, for example, at approximately a 90° angle. In other examples, the support pillars 806(a)-(b) may project out from the silicon chip 802 at an angle between 0° and 90° from the plane of the silicon chip 802. In some examples, the two support pillars 806(a)-(b) may define the plates of a capacitor.

Device 800 may also comprise two or more electrodes 809(a)-(b). The electrodes 809(a)-(b) may be constructed of a conductive material such as sintered copper, silver, or aluminum nanoparticles, or a conductive polymer. The electrodes 809(a)-(b) may be disposed at least partially between the support pillars 806(a)-(b). Electrode 809(a) may be in contact with support pillar 806(a), while electrode 809(b) may be in contact with support pillar 806(b). The electrodes 809(a)-(b) may have the same dimensions as one or both of the support pillars 806(a)-(b), or the electrodes 809(a)-(b) may be smaller or larger than one or both of the support pillars 806(a)-(b). For example, as shown in FIG. 8, the electrodes 809(a)-(b) may be thicker than the support pillars 806(a)-(b) and may also be shorter than the support pillars 806(a)-(b). In some examples, the electrodes 809(a)-(b) may be coupled to the support pillars 806(a)-(b) but may not be in contact with the passivation layer 804 or the silicon chip 802. In some examples, the support pillars 806(a)-(b) may comprise a conducting material and act as electrodes. In such cases, the electrodes 809(a)-(b) may be absent from device 800.

Device 800 may also comprise a dielectric 808, which may be disposed at least partially between the electrodes 809(a)-(b) and may be in contact with the support pillars 806(a)-(b). The dielectric 808 may have the same dimensions as one or both of the support pillars 806(a)-(b), or the dielectric 808 may be smaller or larger than one or both of the support pillars 806(a)-(b). For example, as shown in FIG. 8, the dielectric 808 may be thicker than the support pillars 806(a)-(b) and may also be shorter than the support pillars 806(a)-(b). In some examples, the dielectric 808 may be coupled to the electrodes 809(a)-(b) but may not be in contact with the passivation layer 804 or the silicon chip 802. The dielectric 808 may be solid and may have high permittivity, or the dielectric 808 may be at least partially hollow or otherwise porous.

The dielectric 808 may comprise a nanoparticle ink of a dielectric material, such as, for example, sintered barium titanate or a composite of barium titanate particles embedded in a polymer, such as acrylate urethane. In some examples, the dielectric 808 may be air, and may define a gap between the electrodes 809(a)-(b). The dielectric 808, the electrodes 809(a)-(b), and the support pillars 806(a)-(b) may collectively define a three-dimensional capacitor that projects out from the silicon chip 802. As described above, the three-dimensional capacitor may project out from the silicon chip 802 less than 1 mm or more than 1 mm. By way of example, the three-dimensional capacitor may project from the silicon chip 802 between approximately 400 µm and approximately 1 mm, which may provide less parasitic loss within the system. The three-dimensional capacitor may also project from the silicon chip 802 between 1 mm and 3 mm, which may provide greater isolation from the silicon chip 802.

Device 800 may further comprise a conductive trace 810. The conductive trace 810 may define a conductive material, such as, for example, a sintered nanoparticle ink that comprises silver, cupric oxide, copper, platinum, gold, aluminum, or a combination thereof. In some examples, the conductive trace 810 may be made of conductive polymer. A portion of the conductive trace 810 may be disposed on the passivation layer 804 and/or may be embedded partially or wholly in the passivation layer 804 or the substrate 802. This portion of the conductive trace 810 may define an input to receive an incoming signal. The conductive trace 810 may be disposed such that the conductive trace 810 is in contact with the support pillars 806(a)-(b), the electrodes 809(a)-(b), and the dielectric 808. The conductive trace 810 be disposed such that electric current may flow through the conductive trace 810 from support pillar 806(a), to electrode 809(a).

The conductive trace 810 be disposed such that the electric current flows through the conductive trace 810 from support pillar 806(b), to electrode 809(b). The electrodes 806(a) and 806(b) may be electrically insulated from each other. In some examples, the current from the incoming metal trace 810 may create an applied electric field in the dielectric 808. The electric field may not allow an electric charge to flow through the dielectric 808, but may cause dielectric polarization within the dielectric 808. This may create an internal electric field.

The conductive trace 810 may have a variety of thicknesses. For example, the conductive trace 810 may have a thickness in the nanometer range, in the micrometer range, or, in some examples, the conductive trace 810 may have a thickness in the millimeter range. The conductive trace 108 may be have an approximately rectangular, circular, or square cross-section with a width in the micrometer range, such as, for example, 10 µm.

A portion of the conductive trace 810 may continue on into the passivation layer 804 and/or the silicon chip 802 and may be coupled or otherwise in electronic communication with other components disposed within the silicon chip 802 or other components coupled to the silicon chip 802. This portion of the conductive trace 810 may define an output to transmit an outgoing signal. In some examples, the support pillars 806(a)-(b) are conductive and act as electrodes, and in which case the electrodes 809(a)-(b) may be absent. In these examples, the conductive trace 810 may make contact only with the support pillars 806(a)-(b).

Figure 9:
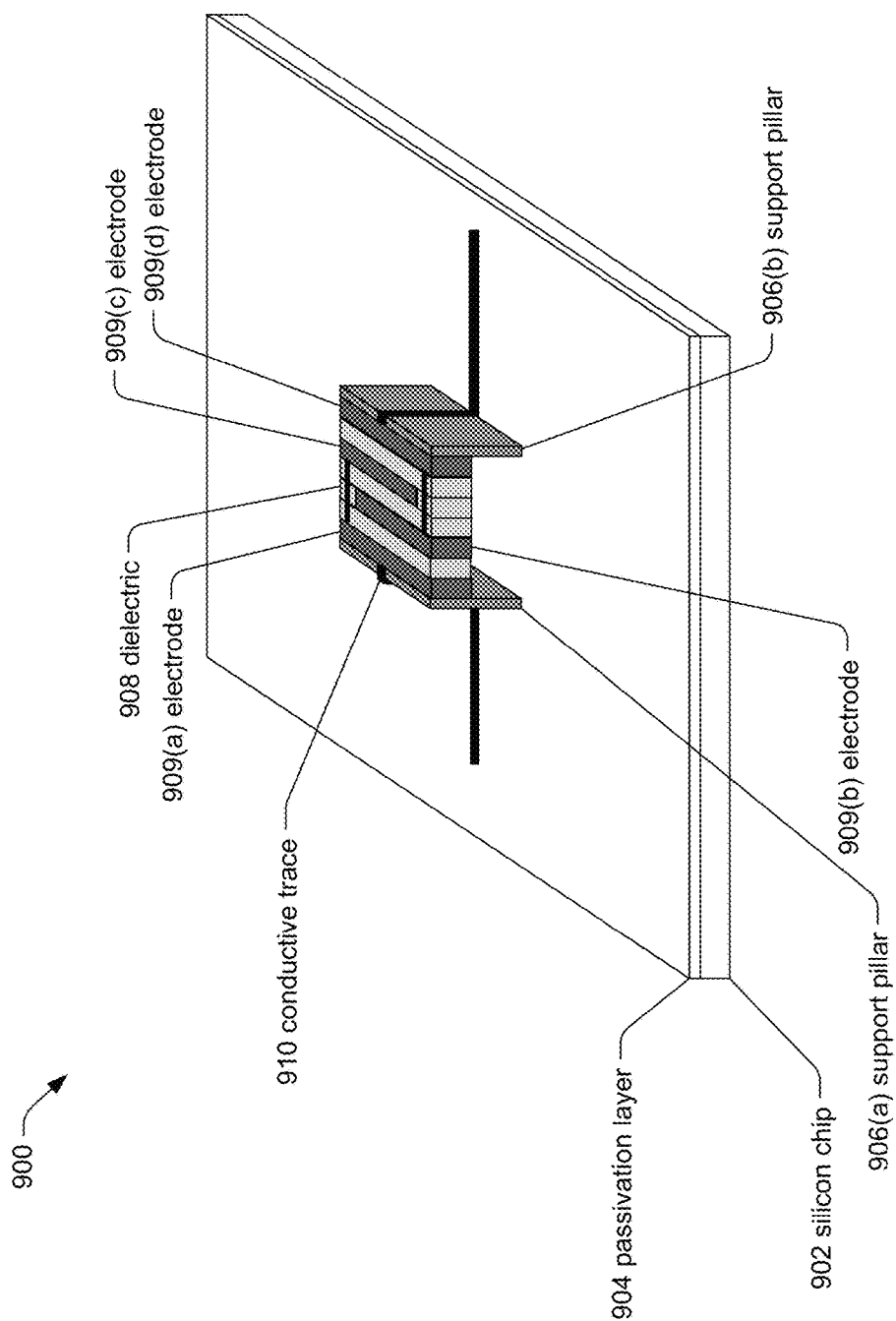
FIG. 9 illustrates a perspective view of another example three-dimensional capacitor.

FIG. 9 is a perspective view of an example three-dimensional capacitor device 900. Device 900 may have the same or similar components as those shown in FIG. 8. For example, device 900 may comprise a silicon chip 902, a passivation layer 904, support pillars 906(a)-(b), a dielectric 908, and a metal trace 910. Device 900 illustrates an example configuration with multiple capacitors. For example, multiple electrodes 909(a)-(d) may be disposed between support pillars 910(a)-(b). As shown in FIG. 9, electrodes 909(a) and 909(b) may serve as electrodes for the portion of the dielectric 908 disposed between electrodes 909(a) and 909(b). Likewise, electrodes 909(b) and 909(c) may serve as electrodes for the portion of the dielectric 908 disposed between electrodes 909(b) and 909(c). Electrodes 909(c) and 909(d) may serve as electrodes for the portion of the dielectric 908 disposed between electrodes 909(c) and 909(d). While FIG. 9 shows an example device 900 with three capacitors, this disclosure includes devices that comprise as few as one capacitor and up to as many capacitors as will fit on the substrate, which in FIG. 9 is shown to be a silicon chip 902. For example, the number of capacitors may be from 1 to 10, from 5 to 10, from 5 to 30, from 20 to 30, from 1 to 100, or more than 100. Device 900 may allow for thinner dielectric layers, such as approximately 50 nm in thickness, than would be possible in conventional two-dimensional capacitors.

As described in FIGS. 1-9, various components of devices 100-500 and 800-900 have been described as components of certain examples of the three-dimensional passive component architectures described herein. However, it should be understood that in some examples each component described herein may be included in any or all of devices 100-500 and 800-900, and the inclusion of a component in one example does not exclude its potential inclusion in other examples. Additionally, multiples of the components of devices 100-500 and 800-900 may also be included. Furthermore, it should be understood that the three-dimensional passives described in FIGS. 1-5 regarding inductors and the three-dimensional passives describes in FIGS. 8 and 9 regarding capacitors may be incorporated onto the same silicon chip or substrate.

The devices described in FIGS. 1-9 may alleviate some or all of the shortcomings of current two-dimensional architectures by allowing for on-chip voltage regulation, on-chip chip-to-chip communication, compaction, enablement of beamforming chips for aircraft communication, antenna communication and/or decreased parasitic loss. Devices 100-500 and 800-900 described herein comprise three-dimensional inductors and capacitors, which may be manufactured via direct-write methodologies and may be used, for example, to assist in on-chip power regulation and supply.

Example Methods

Figure 10:
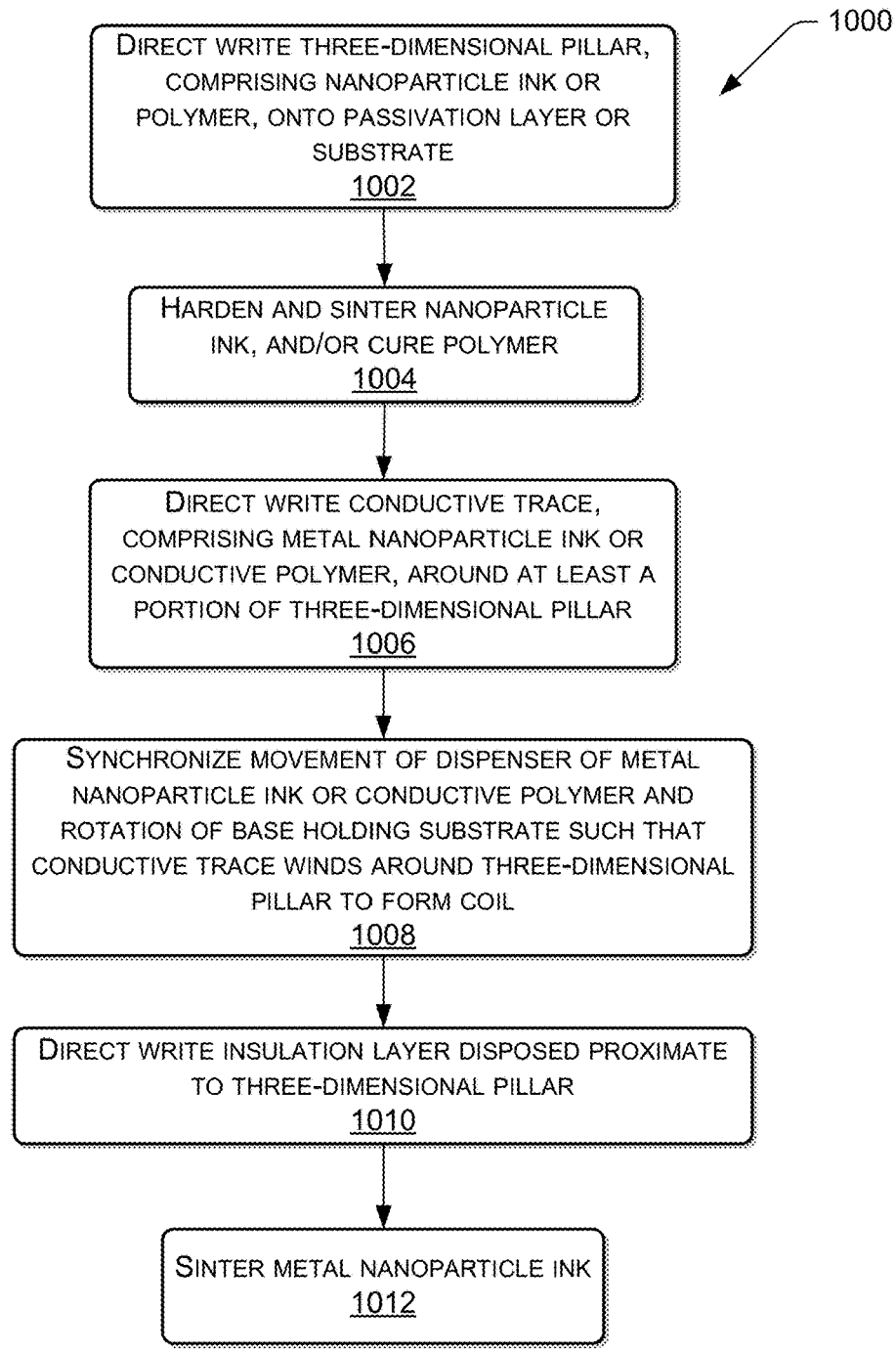
FIG. 10 is a flowchart illustrating an example method by which a three-dimensional inductor may be manufactured.
Figure 11:
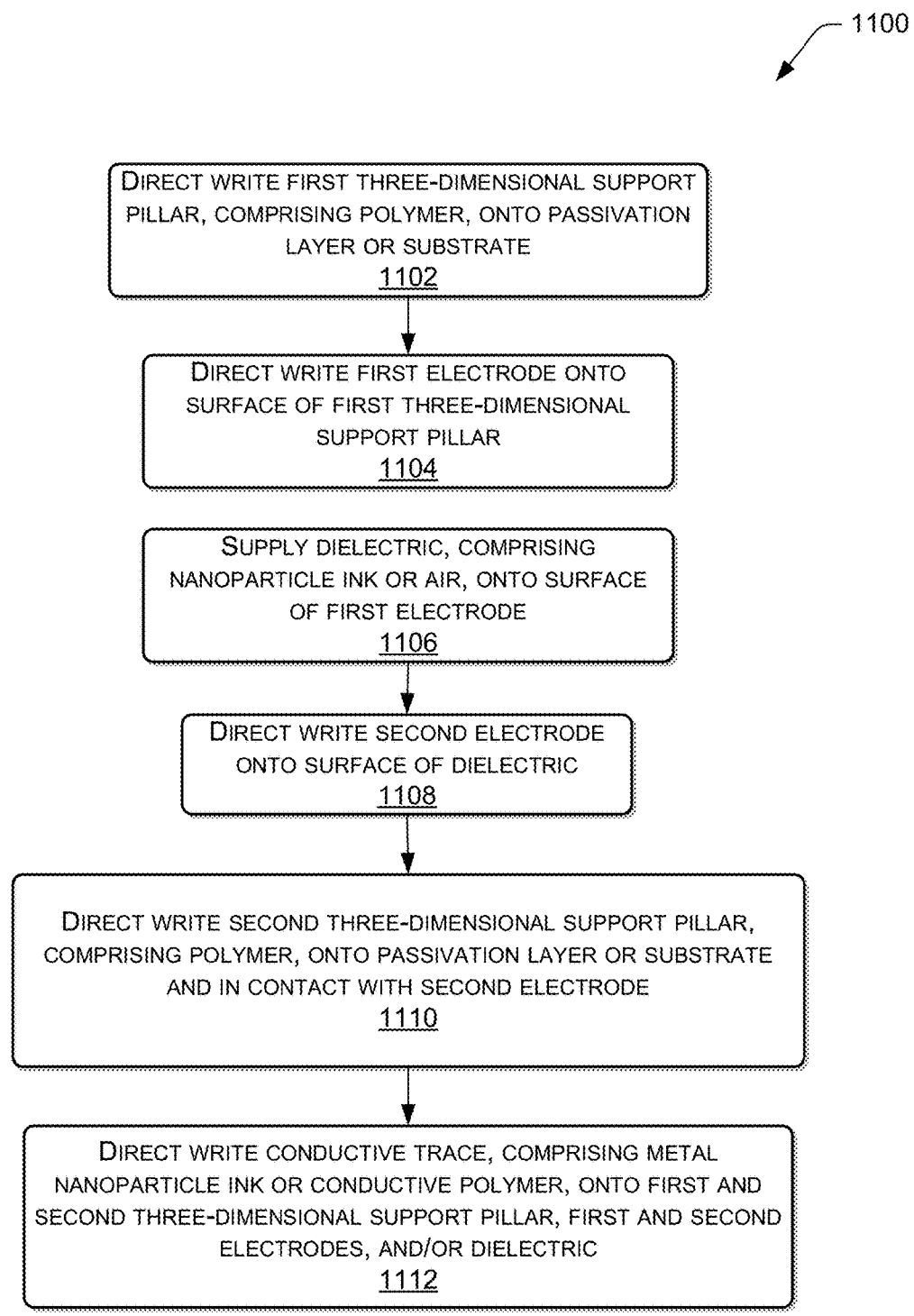
FIG. 11 is a flowchart illustrating an example method by which a three-dimensional capacitor may be manufactured.

FIGS. 10 and 11 illustrate example methods of manufacturing three-dimensional passive components, such as those described herein. Methods 1000 and 1100 are illustrated as logical flow graphs. The order in which the operations or steps are described is not intended to be construed as a limitation, and any number of the described operations can be omitted, modified, or combined in any order and/or in parallel to implement methods 1000 and 1100. For example, while direct writing the dielectric is described as being performed prior to direct writing the second three-dimensional pillar, in other examples, the second three-dimensional pillar may be direct written before the dielectric is direct written.

FIG. 10 illustrates a method 1000 of manufacturing a three-dimensional inductor architecture. At block 1002, method 1000 may comprise direct writing a three-dimensional pillar, comprising a nanoparticle ink or a polymer with or without embedded nanoparticles, onto a passivation layer disposed on a surface of a substrate or directly onto a substrate. The substrate may be any substrate used in microelectronics, but in some examples, the substrate may be silicon based. The substrate may also comprise a variety of geometries. The passivation layer may be disposed on more than one surface of the substrate, but in some examples, the passivation layer may cover the upper surface of the substrate. The passivation layer may cover all or only a portion of the substrate. The passivation layer may comprise any material that enhances the effectiveness of the substrate and enhances its insulation. In some examples, the passivation layer may be constructed of an oxide, such as, for example, silicon dioxide or titanium dioxide. In other examples, the passivation layer may be constructed of silicon nitride. The passivation layer may have a variety of thicknesses and densities depending on the properties of the substrate.

The three-dimensional pillar may comprise a ferromagnetic material, such as, for example, a sintered or un-sintered nanoparticle ink comprising iron, barium titanate, germanium telluride, polyvinylidene fluoride, or a combination thereof. Additionally, the three-dimensional pillar may be constructed of polymer or of a composite consisting of ferromagnetic nanoparticles mixed with a polymer that can be cured substantially instantaneously, for example, upon deposition by, for example, ultraviolet light. Other sintering or curing techniques, including but not limited to, heating, oxidizing, laser, photonic flash, and chemical reaction may be used. The three-dimensional pillar may also define a number of geometries, such as, for example, a rectangular cuboid, a cube, a cylinder, a truncated cone, or some other shape that may roughly resemble a defined geometry with slight variances in shape. The pillar may also have gradually changing cross-section with respect to height as in a truncated cone. In some examples, the three-dimensional pillar may project out from the substrate. More specifically, unlike conventional passive structures that are planar and embedded in one or more layers of the substrate, the three-dimensional pillar may project from the substrate, such as, for example, from the top layer of the substrate. In some examples, the three-dimensional pillar may project from the substrate less than 1 mm, while in other examples, the three-dimensional pillar may project from the substrate more than 1 mm. By way of further example, the three-dimensional pillar may project from the substrate between approximately 400 µm and approximately 1 mm, which may provide less parasitic loss within the system. The three-dimensional pillar may also project from the substrate between approximately 1 mm and approximately 3 mm, which may provide greater inductance. The three-dimensional pillar may be solid (otherwise known as filled) or may comprise a partially hollow interior. In some examples, the three-dimensional pillar may project transversely from the substrate, such as, for example, at approximately a 90° angle. In other examples, the three-dimensional pillar may project from the substrate at an angle between 0° and 90° from the plane of the substrate.

At block 1004, method 1000 may comprise sintering the nanoparticle ink using, for example, ultraviolet light. Other curing techniques, including but not limited to, heating, oxidizing, laser, photonic flash, and chemical reaction may be used. In some examples, the method 1000 may comprise curing the polymer pillar using, for example, ultraviolet light. In some examples, the sintering or curing may be performed at or near the same time that direct writing of the three-dimensional pillar takes place. For example, a dispenser may dispense the nanoparticle ink onto the passivation layer or the substrate. As the nanoparticle ink is being dispensed, an energy source may harden, cure, heat, or otherwise sinter the nanoparticle ink. The dispenser may be moved and/or tilted while continuing to dispense nanoparticle ink such that additional layers of nanoparticle ink are dispensed while the energy source sinters the nanoparticle ink. This process of direct writing and substantially simultaneous curing may result in the creation of a three-dimensional pillar as a core of the inductor as described herein.

At block 1006, method 1000 may comprise direct writing a conductive trace, comprising metal nanoparticle ink or other conducting materials, around at least a portion of the three-dimensional pillar. The conductive trace may define a conductive material, such as, for example, a nanoparticle ink that comprises silver, cupric oxide, copper, platinum, gold, aluminum, or a combination thereof. In some examples, the method 1000 may comprise other materials such as a conductive polymer, for example, polyacetylene, polyphenylene vinylene, or polypyrrole. In some examples, the conductive trace may define a coil that may be wound at least partially around the three-dimensional pillar. A portion of the conductive trace may be disposed on the passivation layer and/or may be embedded partially or wholly in the passivation layer or the substrate. This portion of the conductive trace may define an input to receive an incoming signal. The conductive trace may be wound around the three-dimensional pillar once or multiple times. The number of times that the conductive trace is wound around the pillar is not limiting, and may be as little as 1 time or as many times as possible such that the exterior sides of the three-dimensional pillar are completely or substantially completely surrounded by the conductive trace without the coils of the conductive trace being in contact with each other. The conductive trace may also have a variety of thicknesses. For example, the conductive trace may have a thickness in the nanometer range, in the micrometer range, or, in some examples where the three-dimensional pillar projects out from the substrate more than 1 mm, the conductive trace may have a thickness in the millimeter range. The conductive trace may have an approximately rectangular, circular, or square cross-section with a width in the micrometer range, such as, for example, approximately 10 µm.

At block 1008, the conductive trace may be direct written around at least a portion of the three-dimensional pillar, by, for example, synchronizing movement of a dispenser of the metal nanoparticle ink or the conductive polymer and rotation of a base holding the substrate such that the conductive trace wraps around the three-dimensional pillar to form a coil. The quantity of metal nanoparticle ink released by the dispenser and the speed of rotation of the base may be correlated to promote the even and continuous direct writing of the metal trace. The dispenser and/or the base may move up and down, or may tilt, to allow the conductive trace to wrap continuously around the three-dimensional pillar. In some examples, a source of energy such as heat or ultraviolet light may be applied to the substrate such that the metal nanoparticle ink or the conductive polymer are hardened and/or cured and/or sintered as they impact the outer surface of the pillar.

At block 1010, an insulation layer may be direct written and substantially instantaneously cured proximate to the pillar. A portion of the conductor trace may be direct written over the insulation layer such that the portion of the conductor trace written over the insulation layer does not contact the coils of the conductive trace wrapped around the pillar. The metal trace may continue on into the passivation layer and/or the substrate and may be coupled or otherwise in electronic communication with other components disposed within the substrate or other components coupled to the substrate. This portion of the metal trace may define an output to transmit an outgoing signal. In some examples, the signal may travel in reverse direction depending upon the requirements of the connected electrical circuit.

At block 1012, method 1000 may comprise sintering the metal nanoparticle ink using, for example, ultraviolet light. Other curing techniques, including but not limited to, heating, oxidizing, laser, photonic flash, and chemical reaction may be used. This curing operation may be similar to the curing operation at block 1004. In some examples, at block 1012, method 1000 may comprise curing the conductive polymer using, for example, ultraviolet light. Other curing techniques, including but not limited to heating, oxidizing, laser, photonic flash, and chemical reaction may be used. Specifically, in some examples, the sintering and/or curing may be performed at or near the same time that direct writing of the metal nanoparticle ink or the conductive polymer takes place. For example, a dispenser may dispense the metal nanoparticle ink or the conductive polymer onto the passivation layer and/or onto the three-dimensional pillar. As the ink or polymer is being dispensed, an energy source may cure, harden, or sinter the metal nanoparticle ink, curing the metal nanoparticle ink in the process. The dispenser may be moved while continuing to dispense metal nanoparticle ink or conductive polymer such that a continuous stream or flow of metal nanoparticle ink or conductive polymer is dispensed while the energy source cures or sinters the conductive polymer and metal nanoparticle ink, respectively. This process of direct writing and substantially simultaneous curing may result in the creation of continuous conductive trace wound at least partially around the three-dimensional pillar. The direct writing and sintering and/or curing operations described herein may define a three-dimensional printing technique.

While sintering, curing and hardening operations have been described herein as occurring during direct writing, all or some of the curing and/or sintering and/or hardening operations may occur after direct writing. Additional hardening and/or sintering operations may be desired to make some of the components of the devices described herein conductive.

FIG. 11 illustrates a method 1100 of manufacturing a three-dimensional capacitor architecture. Method 1100, or specific operations of method 1100, may be performed in addition to the operations in method 1100. At block 1102, method 1100 may comprise direct writing a first three-dimensional support pillar, comprising a polymer, onto a passivation layer disposed on a surface of a substrate or onto a substrate. The substrate may comprise a plurality of layers, with some or all of the layers holding one or more components found in an integrated circuit. The passivation layer may cover all or only a portion of the substrate. The passivation layer may comprise any material that enhances the effectiveness of the substrate. In some examples, the passivation layer may be constructed of an oxide, such as, for example, silicon dioxide or titanium dioxide. In other examples, the passivation layer may be constructed of silicon nitride. The passivation layer may have a variety of thicknesses and densities depending on the properties of the substrate.

The first three-dimensional support pillar may comprise a polymeric material, such as, for example, acrylate urethane. The first three-dimensional support pillar may also comprise a conducting polymer or a metal nanoparticle ink such that the first three-dimensional support pillar represents a portion of an electrode. The first three-dimensional support pillar may define a number of geometries, such as, for example, a rectangular cuboid, a cube, a cylinder, or some other shape that may roughly resemble a defined geometry with slight variances in shape. In some examples, the first three-dimensional support pillar may project out from the substrate. More specifically, unlike conventional passive structures that are in-plane and embedded in one or more layers of the substrate, the first three-dimensional support pillar may project from the substrate, such as, for example, from the top layer of the substrate. In some examples, the first three-dimensional support pillar may project from the substrate less than 1 mm, while in other examples, the first three-dimensional support pillar may project from the substrate more than 1 mm. By way of further example, the first three-dimensional support pillar may project from the substrate between approximately 400 µm and approximately 1 mm, which may provide less parasitic loss within the system. The first three-dimensional support pillar may also project from the substrate between 1 mm and 3 mm, which may provide greater capacitance. The first three-dimensional support pillar may be solid (otherwise known as filled) or may comprise a partially hollow interior. In some examples, the first three-dimensional support pillar may project transversely from the substrate, such as, for example, at approximately a 90° angle. In other examples, the first three-dimensional support pillar may project from the substrate at an angle between 0° and 90° from the plane of the substrate.

The polymer of the first three-dimensional support pillar may be cured, for example, using ultraviolet light. Other curing techniques, including but not limited to, heating, oxidizing, laser, photonic flash, and chemical reaction may be used. In some examples, the curing may be performed at or near the same time that direct writing of the first three-dimensional support pillar takes place. For example, a dispenser may dispense the polymer onto the passivation layer or substrate. As the polymer is being dispensed, an energy source may cure, heat, or sinter the polymer. The dispenser may be moved while continuing to dispense polymer such that additional layers of polymer are dispensed while the energy source cures the polymer. This process of direct writing and substantially simultaneous curing may result in the creation of a first three-dimensional support pillar as described herein.

At block 1104, method 1100 may comprise direct writing a first electrode, comprising a conductive nanoparticle ink or a conductive polymer, onto a surface of the first three-dimensional support pillar. The first electrode may have the same dimensions as the first three-dimensional support pillar, or the first electrode may be smaller or larger than the first three-dimensional support pillar. For example, the first electrode may be thicker than the first three-dimensional support pillar and may also be shorter than the first three-dimensional support pillar. In some examples, the electrode may be coupled to the first three-dimensional support pillar but may not be in contact with the passivation layer or the substrate.

At block 1106, method 1100 may comprise direct writing a dielectric, onto a surface of the first electrode. The dielectric may solid and may have high permittivity, or the dielectric may be at least partially hollow or otherwise porous. In some examples, the dispensed dielectric may comprise of sintered or un-sintered barium titanate, or a polymer, or a composite of barium titanate particles embedded in a polymer, such as acrylate urethane. In some examples, the dielectric may be air, and may define a gap between the electrodes. The dielectric may have the same dimensions as the first three-dimensional support pillar, or the dielectric may be smaller or larger than the first three-dimensional support pillar. For example, the dielectric may be thicker than the first three-dimensional support pillar and may also be shorter than the first three-dimensional support pillar. In some examples, the dielectric may be coupled to the first electrode but may not be in contact with the passivation layer or the substrate. The dielectric may be cured using the curing methods described herein.

At block 1108, method 110 may comprise direct writing a second electrode onto a surface of the dielectric. The second electrode may be similar to the first electrode. The second electrode may be cured using the curing methods described herein.

At block 1110, method 1100 may comprise direct writing a second three-dimensional support pillar, comprising the polymer, onto the passivation layer such that the second three-dimensional support pillar is in contact with the second electrode. The dielectric may be disposed at least partially between the first electrode and the second electrode. The second three-dimensional support pillar may be made of materials similar to those of the first three-dimensional support pillar and may otherwise have the same or similar properties of the first three-dimensional support pillar. The second three-dimensional support pillar may be cured using the curing techniques described herein.

At block 1110, method 1100 may further comprise the support pillars being constructed by dispensing a conducting material that may act as the electrodes. In such cases, the electrodes described in at block 1104 and 1108 may be absent, while the support pillars act as the electrodes. The dielectric may then be dispensed over the support pillar similar to the operations described at block 1106.

The dielectric, the first and second electrodes, and the first and second three-dimensional support pillars may collectively define a capacitor that projects out from the substrate. As described above, the three-dimensional capacitor may project out from the substrate less than 1 mm or more than 1 mm. By way of example, the three-dimensional capacitor may project from the substrate between approximately 400 µm and approximately 1 mm, which may provide less parasitic loss within the system. The three-dimensional capacitor may also project from the substrate between 1 mm and 3 mm, which may provide greater capacitance.

At block 1112, method 1100 may comprise direct writing a conductive trace, comprising a sintered metal nanoparticle ink or a conductive polymer, onto the first three-dimensional support pillar, the second three-dimensional support pillar, the first electrode, the second electrode, and the dielectric. The conductive trace may define a conductive material, such as, for example, a sintered metal nanoparticle ink that comprises silver, cupric oxide, copper, platinum, gold, aluminum, or a combination thereof. In some examples, the conductive trace can be made of conductive polymer. A portion of the conductive trace may be disposed on the passivation layer and/or may be embedded partially or wholly in the passivation layer or the substrate. This portion of the conductive trace may define an input to receive an incoming signal. The metal trace may be disposed such that the metal trace is in contact with the support pillars, the electrodes, and the dielectric. The metal trace may be disposed such that electric current may flow through the metal trace from the first three-dimensional support pillar, to the first electrode. The conductive trace may be disposed such that the electric current flows through the second electrode, and to the second three-dimensional support pillar. In some examples, the current from the incoming metal trace may create an applied electric field in the dielectric. The electric field may not allow an electric charge to flow through the dielectric, but may cause dielectric polarization within the dielectric. This may create an internal electric field. The conductive trace may have a variety of thicknesses. For example, the metal trace may have a thickness in the nanometer range, in the micrometer range, or, in some examples, the metal trace may have a thickness in the millimeter range. The conductive trace may have an approximately rectangular, circular, or square cross-section with a width in the micrometer range. A portion of the conductive trace may continue on into the passivation layer and/or the substrate and may be coupled or otherwise in electronic communication with other components disposed within the substrate or other components coupled to the substrate. This portion of the metal trace may define an output to transmit an outgoing signal. The metal trace may be cured using the curing techniques described herein.

FIGS. 12A-12F illustrate method 1000 of manufacturing a three-dimensional inductor. At FIG. 12A, the pillar may be direct written on the passivation layer or the substrate using a dispenser with a deposition head. The dispenser may dispense nanoparticle ink, such as a ferromagnetic material, or a polymer or a polymer containing ferromagnetic nanoparticles while an energy source hardens the dispensed material substantially simultaneously. The dispenser and/or the substrate may raster to build up the pillar. At FIG. 12B, the dispenser and energy source continue to build up the pillar, with the dispenser and or the substrate moving to allow for increased dimensional of the pillar as it is formed. At FIG. 12C, the conductive trace is direct written. A deposition head may be tilted or otherwise adjusted such that the metal nanoparticle ink or the conductive polymer may be dispensed as shown. The deposition head and/or the substrate may move up and down, and/or may rotate, to allow the conductive trace to be direct written as coils wound around the pillar. The metal nanoparticle ink or the conductive polymer may be hardened or cured or sintered during or after deposition. At FIG. 12D, an insulation layer may be direct written proximate to the pillar and may be substantially instantaneously hardened, cured, or sintered. As shown, the insulation layer may be disposed such that it covers a portion of the conductive trace wound around the pillar. At FIG. 12E, the conductive trace continues to be direct written onto and over the insulation layer such that the portion of the conductive trace that is direct written onto the insulation layer does not contact the coils of the conductive trace wound around the pillar. At FIG. 12F, the conductive trace may terminate on the substrate or passivation layer, creating a completed three-dimensional inductor.

FIGS. 13A-13E illustrate method 1000 of manufacturing a three-dimensional inductor with an alternative metal trace writing operation. As shown, FIGS. 13A-C may illustrate the same operations as illustrated in FIGS. 12A-12C. At FIG. 12D, a conductive pad may be direct written on a top portion of the pillar. The conductive trace wound around the pillar may terminate at the pad. At FIG. 12E, a conductive wire may be coupled to the pad on the top of the pillar and may extend down to the passivation layer and/or the substrate by suitable method such as wire bonding. Another pad may be disposed on the passivation layer or substrate and may receive the wire. The wire may be disposed such that it does not contact the coils of the metal trace wound around the pillar.

FIGS. 14A-14E illustrate method 1000 of manufacturing a three-dimensional inductor with an alternative pillar writing operation. At FIG. 14A, a polymeric material may be dispensed from the deposition head such that a shell is formed with an at least partially hollow interior. At FIG. 14B, the dispenser may dispense a nanoparticle ink, such as, for example, a ferromagnetic material, into the hollow interior. The nanoparticle ink may remain in a liquid state, or the nanoparticle ink may be hardened, cured, or sintered to a substantially solid state. Additional polymeric material may be used to cover the top of the nanoparticle ink, thereby encapsulating the nanoparticle ink. As shown, FIGS. 14C-14F may illustrate the same operations as illustrated in FIGS. 12C-12F.

FIGS. 15A-15F illustrate method 1100 of manufacturing a three-dimensional capacitor. At FIG. 15A, a support pillar may be direct written on a substrate or passivation layer using a dispenser with a deposition head. The dispenser may dispense a polymeric material while an energy source hardens the polymeric material substantially simultaneously. The dispenser and/or the substrate may raster to build up the support pillar. At FIG. 15B, an electrode may be direct written on the support pillar using the dispenser. The dispenser may dispense a metal nanoparticle ink or a conductive polymer, which may be hardened, cured, or sintered substantially simultaneously. At FIG. 15C, a dielectric may be direct written onto the electrode. The dispenser may dispense a dielectric material, which may be hardened, cured, or sintered substantially simultaneously. At FIG. 15D, another electrode may be direct written onto the dielectric using the dispenser. The dispenser may dispense a metal nanoparticle ink or a conductive polymer, which may be hardened, cured, or sintered substantially simultaneously. At FIG. 15E, another support pillar may be direct written onto the substrate or passivation layer such that the other support pillar is in contact with the other electrode. The dispenser may dispense a polymeric material while an energy source hardens the polymeric material substantially simultaneously. At FIG. 15F, a conductive trace may be direct written onto the substrate or passivation layer, the support pillars, the electrodes, and the dielectric.

The term "about" or "approximate" as used in the context of describing a range of volume, pressure, or temperature is to be construed to include a reasonable margin of error that would be acceptable and/or known in the art.

The present description uses specific numerical values to quantify certain parameters relating to the innovation, where the specific numerical values are not expressly part of a numerical range. It should be understood that each specific numerical value provided herein is to be construed as providing literal support for a broad, intermediate, and narrow range. The broad range associated with each specific numerical value is the numerical value plus and minus 60 percent of the numerical value, rounded to two significant digits. The intermediate range associated with each specific numerical value is the numerical value plus and minus 30 percent of the numerical value, rounded to two significant digits. The narrow range associated with each specific numerical value is the numerical value plus and minus 15 percent of the numerical value, rounded to two significant digits. These broad, intermediate, and narrow numerical ranges should be applied not only to the specific values, but should also be applied to differences between these specific values.

Furthermore, this disclosure provides various examples, as described and as illustrated in the figures. However, this disclosure is not limited to the examples described and illustrated herein, but can extend to other examples, as would be known or as would become known to those skilled in the art. Reference in the specification to "one example," "this example," "these examples" or "some examples" means that a particular feature, structure, or characteristic described is included in at least one example. The appearances of these phrases in various places in the specification are not necessarily all referring to the same example, nor are they mutually exclusive. That is, features, structures, and characteristics of one example may, but need not necessarily, be combined with features, structures, and/or characteristics of one or more other examples.

CONCLUSION

Although the disclosure describes examples having specific structural features and/or methodological acts, it is to be understood that the claims are not necessarily limited to the specific features or acts described. Rather, the specific features and acts are merely illustrative of some examples that fall within the scope of the claims of the disclosure.

What is claimed is:
1. A device comprising:
a substrate;
a pillar disposed on at least a portion of the substrate layer, the pillar including at least one of a ferromagnetic material or a polymer, the pillar defining a three-dimensional structure projecting out from the substrate between approximately 1 µm and approximately 1 mm; and
a conductive trace wound at least partially around the pillar.
2. The device of claim 1, wherein:
the ferromagnetic material comprises iron, barium titanate, germanium telluride, polyvinylidene fluoride, or a combination thereof; and
the polymer comprises acrylate urethane.

3. The device of claim 1, wherein the conductive trace comprises sintered silver, cupric oxide, copper, platinum, gold, aluminum, a conducting polymer, or a combination thereof.

4. The device of claim 1, further comprising a passivation layer disposed between the substrate and the pillar.

5. The device of claim 4, wherein the pillar abuts a surface of the passivation layer.

6. A device comprising:
   a silicon chip;
   at least two support pillars disposed on at least a portion of the silicon chip, the at least two support pillars comprising a polymeric material;
   at least two electrodes disposed between the at least two support pillars;
   a dielectric disposed at least partially between the at least two electrodes and in contact with the at least two electrodes; and
   a conductive trace in contact with the at least two support pillars, the at least two electrodes, and the dielectric.

7. The device of claim 6, wherein the dielectric comprises barium titanate, a polymer, a composite of barium titanate and the polymer, or air.

8. The device of claim 6, further comprising passivation layer disposed between the two support pillars and the substrate.

9. The device of claim 8, wherein the three-dimensional capacitor projects out from the substrate between approximately 1 μm and approximately 1 mm.

10. The device of claim 6, wherein the at least two support pillars comprise a conductive material and serve as the at least two electrodes.

\* \* \* \* \*